United States Patent
Nakagawa

(10) Patent No.: US 6,813,203 B2
(45) Date of Patent: Nov. 2, 2004

(54) SEMICONDUCTOR MEMORY DEVICE AND METHOD FOR TESTING SEMICONDUCTOR MEMORY DEVICE

(75) Inventor: Yuji Nakagawa, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/632,899

(22) Filed: Aug. 4, 2003

(65) Prior Publication Data

US 2004/0027895 A1 Feb. 12, 2004

(30) Foreign Application Priority Data

Aug. 8, 2002 (JP) ........................................ 2002-231645

(51) Int. Cl.[7] .............................................. G11C 29/00
(52) U.S. Cl. .................. 365/201; 365/222; 365/189.08; 365/233.5; 365/194; 365/195
(58) Field of Search ........................ 365/189.08, 233.5, 365/233, 194, 195, 191, 222, 201, 236

(56) References Cited

U.S. PATENT DOCUMENTS

| | | | |
|---|---|---|---|
| 4,807,196 A | 2/1989 | Mizukami | 365/189.08 |
| 5,031,128 A | * 7/1991 | Boutigny et al. | 708/212 |
| 5,563,843 A | 10/1996 | Fackenthal et al. | 365/233.5 |
| 6,667,916 B2 | * 12/2003 | Kyung | 365/201 |
| 6,704,229 B2 | * 3/2004 | Haraguchi et al. | 365/201 |
| 2001/0017811 A1 | 8/2001 | Ikeda et al. | 365/222 |

* cited by examiner

Primary Examiner—Andrew Q. Tran
(74) Attorney, Agent, or Firm—Arent Fox PLLC

(57) ABSTRACT

A semiconductor memory device for easily and accurately evaluating a device. The memory device has a first access mode and a second access mode. The memory device includes an entry signal generation circuit to synthesize input signals and generate a first entry signal used to enter the first access mode. A control circuit generates a first mode trigger signal in response to the first entry signal. The control circuit also receives a second entry signal used to enter the second access mode and generates a second mode trigger signal in response to the second entry signal. The entry signal generation circuit logically synthesizes the input signals in a selective manner in accordance with a selection control signal to generate the first entry signal.

21 Claims, 17 Drawing Sheets

SEMICONDUCTOR MEMORY DEVICE AND METHOD FOR TESTING SEMICONDUCTOR MEMORY DEVICE

CROSS-REFERENCE TO RELATED APPLICATION

This application is based upon and claims the benefit of priority from Japanese Patent Application No. 2002-231645, filed on Aug. 8, 2002, the entire contents of which are incorporated herein by reference.

BACKGROUND OF THE INVENTION

The present invention relates to a semiconductor memory device and a method for testing a semiconductor memory device. More particularly, the present invention relates to a semiconductor memory device having functions for processing external and internal accesses, and to a method for testing such a semiconductor memory device.

Electronic information devices incorporate semiconductor memory devices having large memory capacities (i.e., dynamic random access memory (DRAM)). A DRAM has a self-refreshing function to refresh the data of a memory cell in accordance with a counting operation performed by an internal circuit. The DRAM does not require an external device to perform refreshing. This decreases power consumption and simplifies the design of circuits in the periphery of the DRAM.

In a DRAM provided with the self-refreshing function, a timer of an internal circuit generates refresh requests (internal access) at predetermined time intervals. Further, a main controller of an external device generates write/read requests (external access) at certain timings. In other words, internal and external accesses are generated asynchronously. Accordingly, there is a demand for evaluating a DRAM having two asynchronous access modes.

FIG. 1 is a schematic block circuit diagram illustrating the input section of a prior art semiconductor memory device (DRAM) 50 provided with a self-refreshing function.

The DRAM 50 receives a plurality of control signals CTL and a plurality (only two bits shown in FIG. 1) of external address signals ADD via external terminals. The control signals CTL include a chip enable signal /CE, a write enable signal /WE, and an output enable signal /OE. The external address signals ADD include address signals A0 and A1. The signals /CE, /WE, /OE, A0, and A1 are input to a transition detection signal generation circuit 70 via input buffers 61, 62, 63, 64, and 65, respectively. The input buffers 61 to 65 function as initial input stage circuits, which convert an input signal to a signal having a level corresponding to the internal voltage of the device. Further, the input buffers 61 to 65 are each configured by a CMOS inverter or a C/M differential-amplifier.

The transition detection signal generation circuit 70 includes a plurality (five in FIG. 1) of transition detectors (TD) 71 to 75 and a pulse synthesizing circuit 76.

The transition detectors 71, 72, and 73 respectively detect the transition (transition between a high level and a low level) of the control signals CTL (/CE, /WE, and /OE) to generate input detection signals ceb, web, and oeb. The transition detectors 74 and 75 respectively detect the transition of the states (change of each bit) of the input external address signal ADD (A0 and A1) to generate address detection signals ad0 and ad1. The detection signals ceb, web, oeb, ad0, and ad1 are provided to the pulse synthesizing circuit 76.

The pulse synthesizing circuit 76 generates a transition detection signal mtd in accordance with the detection signals ceb, web, oeb, ad0, and ad1 and provides the transition detection signal mtd to a memory control circuit 77. In accordance with the transition detection signal mtd, the memory control circuit 77 generates a word line activation timing signal wl-timing to activate a word line of a memory cell. The word line of a memory cell corresponds to a predetermined read/write address, which is assigned by the external address signal ADD. The timing signal wl-timing is provided to a memory core 79.

A refresh timer 78 is connected to the memory control circuit 77. The refresh timer 78 generates a refresh request signal ref-req at predetermined time intervals and provides the refresh request signal ref-req to the memory control circuit 77. In accordance with the refresh request signal ref-req, the memory control circuit 77 generates a word line activation timing signal wl-timing to activate a word line of a memory cell. The word line of a memory cell corresponds to a predetermined refresh address, which is generated by an internal address counter (not shown).

The memory control circuit 77 further receives a test signal test from a test circuit (not shown) to conduct a test in a test mode in accordance with the test signal test.

FIG. 2 is a schematic block circuit diagram of the memory control circuit 77. The memory control circuit 77 includes a refresh determination circuit 81, an internal command generation circuit 82, and a timing generator 83.

The refresh determination circuit 81 receives the transition detection signal mtd, the refresh request signal ref-req, and the test signal test. In response to the refresh request signal ref-req, the refresh determination circuit 81 generates a refresh start signal ref-start, which starts refreshing (internal access), and a refresh state signal ref-state. The refresh start signal ref-start is provided to the timing generator 83, and the refresh state signal ref-state is provided to the internal command generation circuit 82.

When receiving the transition detection signal mtd before the refresh request signal ref-req, the refresh determination circuit 81 suspends refreshing and does not generate a refresh signal.

In this state, the refresh determination circuit 81 gives priority to read/write operations (external accesses) and starts refreshing after the read/write operations are completed. More specifically, after a read/write state signal rw-state, which is provided from the timing generator 83, is reset, the refresh determination circuit 81 generates the refresh start signal ref-start and the refresh state signal ref-state.

The refresh determination circuit 81 determines the input timings of the refresh request signal ref-req and the transition detection signal mtd, which are asynchronously input, and determines which one of the refreshing operation and the read/write operation has priority when there is more than one access.

In response to the transition detection signal mtd, the internal command generation circuit 82 generates the read/write start signal rw-start, which starts read/write operations, and provides the read/write start signal rw-start to the timing generator 83. When the internal command generation circuit 82 receives the refresh state signal ref-state, the internal command generation circuit 82 provides the read/write start signal rw-start to the timing generator 83 after the refresh state signal ref-state is reset.

The timing generator 83 receives the refresh start signal ref-start and the read/write start signal rw-start. In response to the refresh start signal ref-start, the timing generator 83 generates the word-line activation timing signal wl-timing in correspondence with the refresh address. In response to the read/write start signal rw-start, the timing generator 83 generates the read/write state signal rw-state and generates the word-line activation timing signal wl-timing in correspondence with the predetermined read/write address.

In addition to the word line activation timing signal wl-timing, the timing generator 83 generates other internal operation signals, such as a sense amplifier activation timing signal for activating a sense amplifier. Only the word line activation timing signal wl-timing will be discussed below.

The operation of the DRAM 50 will now be discussed. FIG. 3 is a waveform diagram illustrating the operation of the transition detection signal generation circuit 70.

For example, when the chip enable signal /CE goes low, the transition detector 71 generates the input detection signal ceb (pulse signal). The pulse synthesizing circuit 76 generates the transition detection signal mtd in accordance with the transition signal mtd. Then, for example, when the address signal A0 goes high (1), the transition detector 74 generates an address detection signal ad0 (pulse signal). In accordance with the detection signal ad0, the pulse synthesizing circuit 76 generates the transition detection signal mtd.

In the transition detection signal generation circuit 70, the pulse synthesizing circuit 76 generates the transition detection signal mtd when a transition occurs in any one of the control signals (/CE, /WE, and /OE) and the address signals ADD (A0 and A1).

FIGS. 4 and 5 are waveform charts illustrating the operation of the memory control circuit 77. FIG. 4 illustrates an example in which there is more than one access at the same time and the transition detection signal mtd is provided to the memory control circuit 77 before the refresh request signal ref-req.

Among the control signal CTL and the external address signal ADD, the pulse synthesizing circuit 76 detects the signal that has undergone a transition (i.e., shifting of levels between high and low) and generates the transition detection signal mtd. Then, the refresh timer 78 generates the refresh request signal ref-req. Thus, the refresh operation is performed after the read/write operation.

More specifically, the internal command generation circuit 82 generates the read/write start signal rw-start in accordance with the transition detection signal mtd. The timing generator 83 generates the read/write state signal rw-state and the word line activation timing signal wl-timing in accordance with the read/write start signal rw-start. In this state, a word line corresponding to the predetermined read/write address is activated to read or write cell data.

When the read/write operation is completed and the read/write state signal rw-state is reset, the refresh determination circuit 81 generates the refresh start signal ref-start and the refresh state signal ref-state. In accordance with the refresh start signal ref-start, the timing generator 83 generates the word line activation timing signal wl-timing. This activates the word line corresponding to a predetermined refresh address and refreshes the cell data.

FIG. 5 illustrates an example in which the refresh request signal ref-req is provided to the memory control circuit 77 before the transition detection signal mtd. Contrary to the operations illustrated in FIG. 4, the read/write operation is performed after the refresh operation.

The refresh determination circuit 81 generates the refresh start signal ref-start and the refresh state signal ref-state in accordance with the refresh request signal ref-req. The timing generator 83 generates the word line activation timing signal wl-timing in accordance with the refresh start signal ref-start. This activates the word line corresponding to a predetermined refresh address and refreshes the cell data.

When the refresh operation is completed and the refresh state signal ref-state is reset, the internal command generation circuit 82 generates the read/write start signal rw-start in response to the transition detection signal mtd. In accordance with the read/write start signal rw-start, the timing generator 83 generates the read/write state signal rw-state and the word line activation timing signal wl-timing. In this state, the reading or writing of the cell data is performed.

When there is more than one access at the same time and the read/write operation (external access) is performed after the refreshing operation (internal access), the speed of the read/write operation becomes slowest. That is, the external access time becomes longest. Thus, to evaluate the characteristics of the DRAM 50, which has two access modes (i.e., external access mode and internal access mode), the operation pattern when the external access time becomes maximum (i.e., worst pattern) must be checked.

FIG. 6 is a waveform chart illustrating a test mode. More specifically, FIG. 6 is a waveform chart simulating an operation pattern when a read/write operation is performed after a refresh operation.

In the test mode, the refresh determination circuit 81 receives a test signal test from a test circuit (not shown). When the refresh determination circuit 81 receives the test signal test, the refresh determination circuit 81 generates the refresh start signal ref-start in accordance with the transition detection signal mtd.

The refresh determination circuit 81 asynchronously receives the refresh request signal ref-req and the transition detection signal mtd. Thus, when performing refreshing in response to the refresh request signal ref-req during the test mode, the desired operation pattern is not repeated. Accordingly, in the test mode, the refresh determination circuit 81 generates the refresh start signal ref-start and the refresh state signal ref-state in accordance with the transition detection signal mtd. When the refresh operation is completed and the refresh state signal ref-state is reset, the internal command generation circuit 82 generates the read/write start signal rw-start in accordance with the transition detection signal mtd.

In the test mode, using the generation of the transition detection signal mtd as a trigger, the refresh operation is started to simulate and reproduce the worst pattern so that the external access time can be measured to evaluate the read/write operation.

However, the prior art DRAM 50 has the problems described below.

[1: Problem When Detecting a Deficient Mode]

One problem (deficient mode) of the DRAM 50, for example, when there are successive external accesses, is an operation delay in the device (resulting from process fluctuation, temperature fluctuation, or insufficient voltage margin) that prolongs the cycle length. As a result, the DRAM 50 may not be able to shift to the read/write operation for the next cycle.

FIG. 7 is a waveform chart illustrating such a deficient mode. FIG. 7 illustrates an example in which the transition detection signal mtd is generated when the chip enable signal /CE goes low, the output enable signal /OE goes high, or the address signal ADD (A0 and A1) changes.

When the chip enable signal /CE goes low, the transition detection signal mtd is generated. In accordance with the transition detection signal mtd, the read/write start signal rw-start and the read/write state signal rw-state are generated. This performs the read/write operation.

Then, when the output enable signal /OE goes high, the transition detection signal mtd is generated. In this state, for example, when there is an operation delay in the device, the next cycle cannot be entered. Thus, the read/write start signal rw-start and the read/write state signal rw-state are not generated (the broken lines in FIG. 7 illustrate normal operation).

When there is a deficient mode such as in FIG. 7 and if the address signal ADD changes after the output enable signal /OE goes high as shown in FIG. 8, the read/write start signal rw-start and the read/write state signal rw-state are generated in accordance with the transition detection signal mtd.

In this case, since the read/write operation is started, a deficiency may not be detected even if there actually is a deficient mode. Thus, device evaluation cannot be performed accurately in the prior art.

[Deficiency Related With Test Mode]

In the test mode, the refresh start signal ref-start is generated in accordance with the transition detection signal mtd to start the refresh operation. Thus, during the test mode, a test in the desired operation pattern may not be performed since the refresh operation is not performed during the normal mode.

FIG. 9 is a waveform diagram illustrating an example of an operation pattern during the normal mode. FIG. 9 shows the operation pattern when there is an external request for the write operation and an internal request for the refresh operation and the refresh operation is performed first (worst pattern). In this example, the transition detection signal mtd is generated when the chip enable signal /CE goes low and the write enable signal /WE goes high. In the example of FIG. 9, the write operation is performed when the chip enable signal /CE goes low.

FIG. 10 is a waveform diagram illustrating an example in which the operation pattern of FIG. 9 is performed in the test mode.

In the example of FIG. 10, the transition detection signal mtd is generated when the chip enable signal /CE goes low. The refresh start signal ref-start is generated and the refresh operation is started in accordance with the transition detection signal mtd. When the refresh operation is completed, the read/write start signal rw-start (more specifically, write start signal) is generated and the write operation is started in accordance with the transition detection signal mtd.

Subsequent to the completion of the write operation, when the write enable signal /WE goes high and the transition detection signal mtd is generated in accordance with the write enable signal /WE, the refresh operation is performed for the second time in accordance with the transition detection signal mtd. Accordingly, in the prior art test mode, since the second refresh operation is performed unintentionally, the operation pattern in the normal mode of FIG. 9 cannot be reproduced.

FIG. 11 is a waveform diagram illustrating an example of a further operation pattern in the normal mode. FIG. 11 shows an operation pattern when there are requests for the write operation and the refresh operation at the same time, and the read operation is performed after the write operation. In this example, the transition detection signal mtd is generated when the chip enable signal /CE goes low, the write enable signal /WE goes high, and the output enable signal /OE goes high (not shown). In the example of FIG. 11, the write operation is started when the chip enable signal /CE goes low, and the read operation is started when the output enable signal /OE goes low.

FIG. 12 is a waveform chart illustrating an example when the operation of FIG. 11 is performed in the test mode. The transition detection signal mtd is generated when the chip enable signal /CE goes low. The refresh start signal ref-start is generated and the refresh operation is started in accordance with the signal mtd. When the refresh operation is completed, the read/write start signal rw-start (more specifically, write start signal) is generated and the write operation is started in accordance with the transition detection signal mtd, which functions as a trigger for starting the refresh operation.

Subsequent to the completion of the write operation, when the write enable signal /WE goes high, the transition detection signal mtd is generated in accordance with the write enable signal /WE. The refresh operation is performed for the second time when the refresh start signal ref-start is generated in accordance with the transition detection signal mtd. When the refresh operation is completed, the read/write start signal rw-start (more specifically, read start signal) is generated in accordance with the transition detection signal mtd, which is the trigger of the second refresh operation, to start the read operation.

Accordingly, in the example of FIG. 12, since the second refresh operation is performed unintentionally, the operation pattern in the normal mode of FIG. 11 cannot be reproduced in the test mode.

In the prior art, when an unintentional refresh operation is performed during the test mode, the characteristic evaluation is conducted with an operation pattern differing from the actual pattern. Thus, the device cannot be properly evaluated. When the test mode is performed, power draw increases since an unnecessary refresh operation is performed. Therefore, in accordance with the test result, the guaranteed operation may be over-evaluated or normal functioning may be erroneously determined as abnormal functioning. In other words, in the prior art, the testing cannot be performed with the intended operation pattern, and the device evaluation cannot be performed properly.

SUMMARY OF THE INVENTION

One aspect of the present invention is a semiconductor memory device including first and second access modes and an entry signal generation circuit for logically synthesizing a plurality of input signals to generate a first entry signal used to enter the first access mode. A control circuit is connected to the entry signal generation circuit to generate a first mode trigger signal in response to the first entry signal. When the control circuit receives a second entry signal to enter the second access mode, the control circuit generates a second mode trigger signal in response to the second entry signal. The entry signal generation circuit logically synthesizes the input signals in a selective manner in accordance with a selection control signal to generate the first entry signal.

A further aspect of the present invention is a semiconductor memory device including first and second access modes and an entry signal generation circuit for logically synthesizing a plurality of input signals to generate an entry signal used to enter the first access mode or the second access mode. A control circuit is connected to the entry signal generation circuit to generate a first mode trigger signal, which is used to start the first access mode, in response to the entry signal and to generate a second mode trigger signal, which is used to start the second access mode, in response to the entry signal. The entry signal generation circuit logically synthesizes the input signals in a selective manner in accordance with a predetermined selection control signal to inhibit the generation of the entry signal.

A further aspect of the present invention is a semiconductor memory device including first and second access modes and an entry signal generation circuit for logically synthesizing a plurality of input signals to generate a first entry signal used to enter the first access mode and a second entry signal used to enter the second access mode. A control circuit is connected to the entry signal generation circuit to generate a first mode trigger signal, which is used to start the first access mode, in response to the first entry signal and to generate a second mode trigger signal, which is used to start the second access mode, in response to the second entry signal. The entry signal generation circuit logically synthesizes the input signals in a selective manner in accordance with a predetermined selection control signal to inhibit the generation of the first entry signal or the second entry signal.

A further aspect of the present invention is a method for testing a semiconductor memory device having a first access mode, a second access mode, and a test mode. The method includes receiving a test signal to enter the test mode, receiving a plurality of input signals, selecting at least one of the input signals and detecting transition of the selected at least one of the input signals, and starting one of the access modes in accordance with the transition detection of the selected at least one of the input signals.

A further aspect of the present invention is a method for testing a semiconductor memory device having a first access mode and a second access mode. The method includes receiving a plurality of input signals, logically synthesizing the input signals to generate an entry signal used to enter the first access mode or the second access mode, logically synthesizing the input signals in a selective manner in accordance with the selection control signal to inhibit the generation of the entry signal.

A further aspect of the present invention is a method for testing a semiconductor memory device having a first access mode and a second access mode. The method includes receiving a plurality of input signals, logically synthesizing the input signals to generate a first entry signal used to enter the first access mode, logically synthesizing the input signals to generate a second entry signal used to enter the second access mode, and logically synthesizing the input signals in a selective manner in accordance with the selection control signal to inhibit the generation of the first entry signal or the second entry signal.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
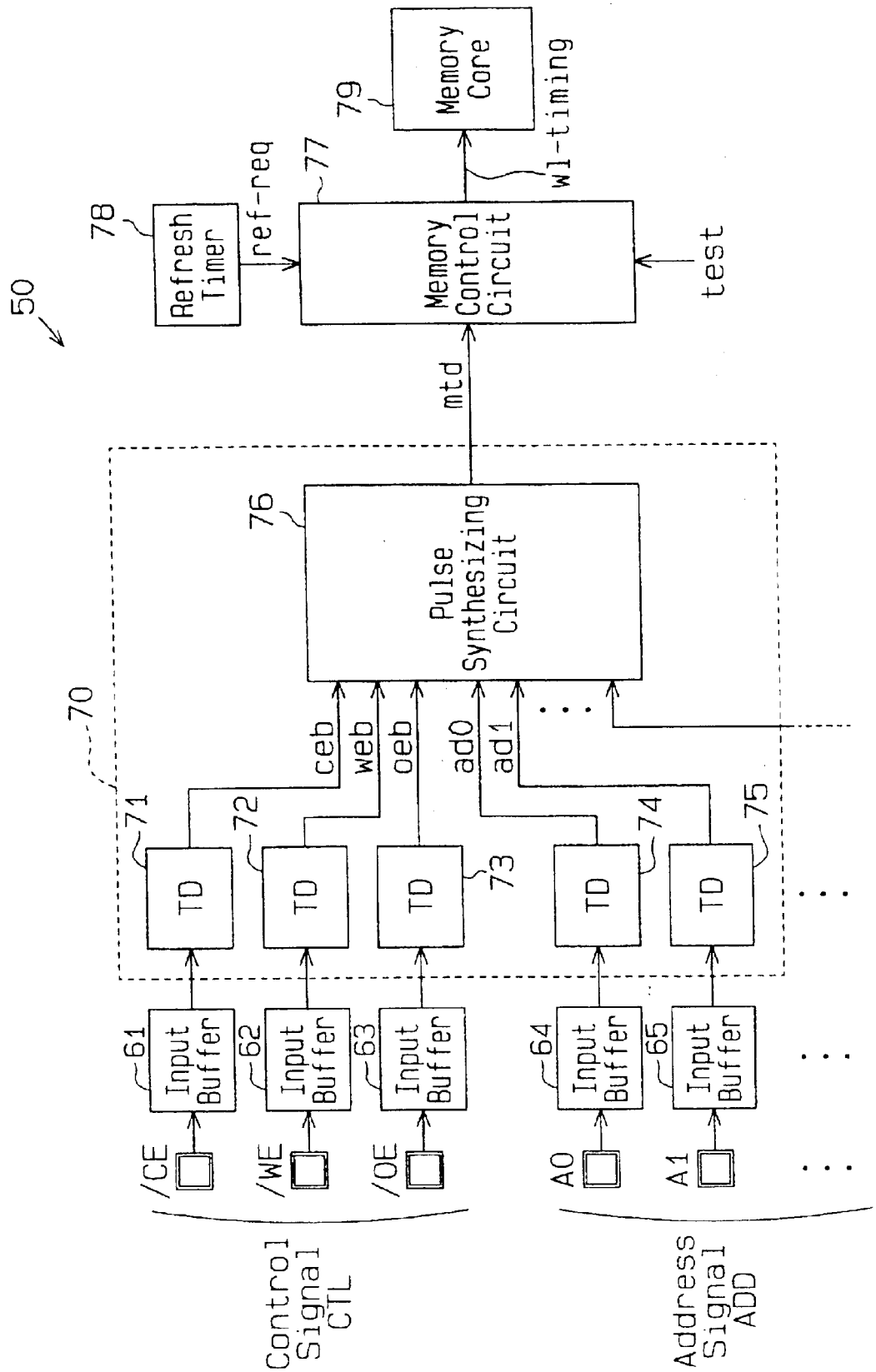
FIG. 1 is a schematic block circuit diagram of a prior art semiconductor memory device.

In the drawings, like numerals are used for like elements throughout.

Figure 13:
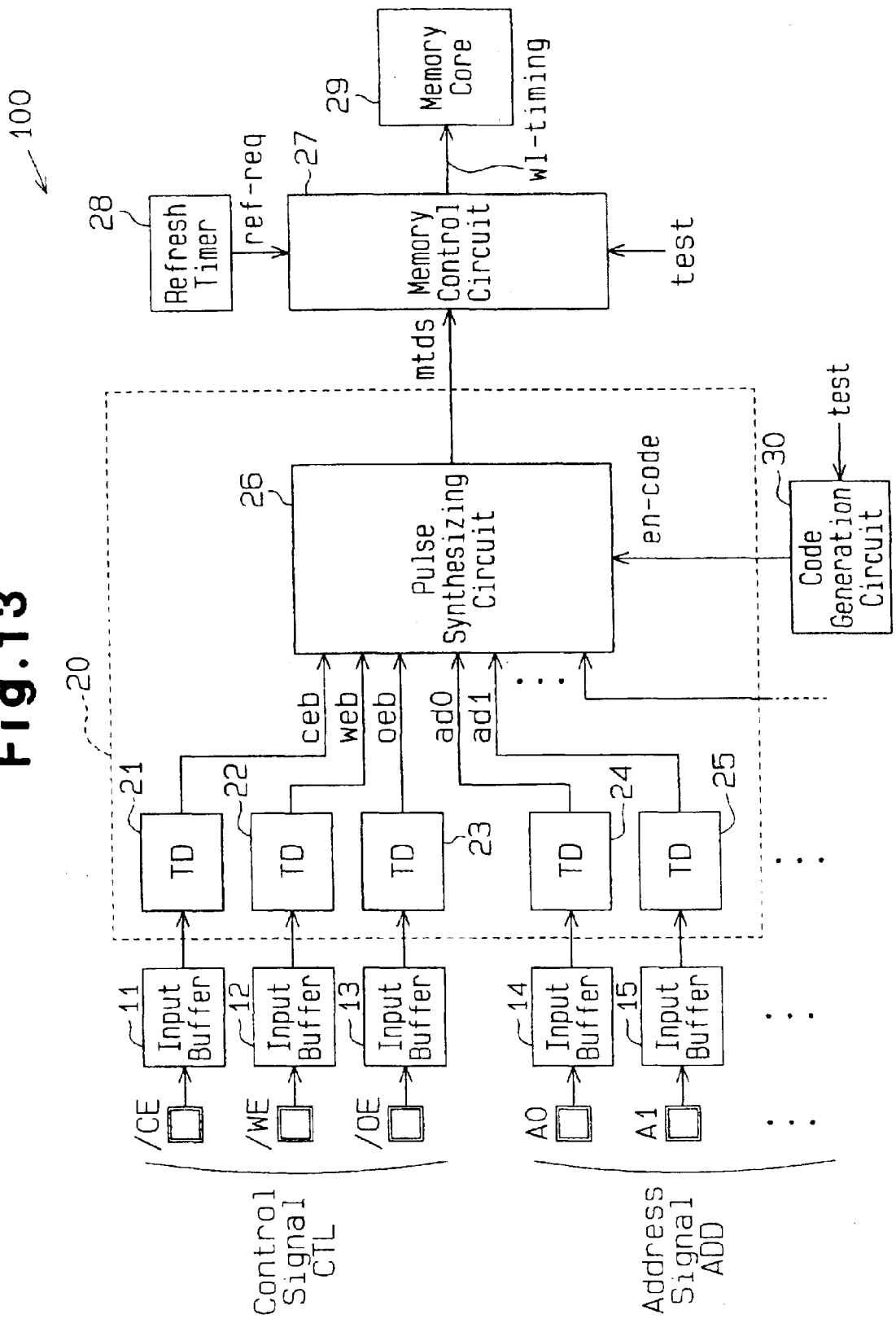
FIG. 13 is a schematic block circuit diagram of a semiconductor memory device according to a first embodiment of the present invention.

FIG. 13 is a schematic block circuit diagram of an input circuit section of a semiconductor memory device (DRAM) 100 according to a first embodiment of the present invention. The DRAM 100 is provided with a self-refreshing function.

The DRAM 100 receives a plurality of control signals CTL and a plurality (only two bits shown in FIG. 13) of external address signals ADD via external terminals. The control signals CTL include a chip enable signal /CE, a write enable signal /WE, and an output enable signal /OE. The external address signals ADD include address signals A0 and A1. The signals /CE, /WE, /OE, A0, and A1 are input to a transition detection signal generation circuit 20 via input buffers 11, 12, 13, 14, and 15, respectively. The input buffers 11 to 15 function as initial input stage circuits, which convert an input signal to a signal having a level corresponding to the internal voltage of the device. Further, the input buffers 11 to 15 are each configured by a CMOS inverter or a C/M differential amplifier.

The transition detection signal generation circuit 20 includes a plurality of (five in FIG. 13) transition detectors (TD) 21 to 25 and a pulse synthesizing circuit 26.

The transition detectors 21, 22, and 23 respectively detect the transition (transition between a high level and a low level) of the control signals CTL (/CE, /WE, and /OE) to generate input detection signals ceb, web, and oeb. The transition detectors 24 and 25 respectively detect the transition of the states (change of each bit) of the input external address signal ADD (A0 and A1) to generate address detection signals ad0 and ad1. The detection signals ceb, web, oeb, ad0, and ad1 are provided to the pulse synthesizing circuit 26.

The pulse synthesizing circuit 26 logically synthesizes the detection signals ceb, web, oeb, ad0, and ad1 to generate a transition detection signal mtds (first entry signal) for performing a read/write process, or an external access (first access mode). The transition detection signal mtds is provided to the memory control circuit 27.

A code generation circuit 30 is connected to the pulse synthesizing circuit 26. In accordance with a test signal, which is provided from a test circuit (not shown), the code generation circuit 30 provides a pulse generation control code (selection control signal) en-code, which is prestored in an internal register (not shown), to a pulse synthesizing circuit 26. The pulse generation control code en-code represents code information set by an input signal (not shown) provided from a plurality of external terminals.

More specifically, the pulse generation control code en-code masks the detection signals ceb, web, oeb, ad0, and ad1, which are provided from a pulse synthesizing circuit 26, when necessary. That is, among the detection signals ceb, web, oeb, ad0, and ad1, the pulse synthesizing circuit 26 selects the signal used for the logic synthesizing in accordance with the pulse generation control code en-code. The signal invalidated by the pulse generation control code en-code does not generate the transition detection signal mtds.

The memory control circuit 27 receives the transition detection signal mtds from the pulse synthesizing circuit 26 and generates a word line activation timing signal wl-timing to activate a word line of a memory cell. The word line of an activated memory cell corresponds to a predetermined read/write address, which is assigned by the external address signal ADD. The timing signal wl-timing is provided to a memory core 29.

A refresh timer 28 is connected to the memory control circuit 27. The refresh timer 28 generates a refresh request signal ref-req (second entry signal) for performing a refresh process, or an internal access (second access mode) at predetermined time intervals and provides the refresh request signal ref-req to the memory control circuit 27.

The memory control circuit 27 receives the refresh request signal ref-req and generates a word line activation timing signal wl-timing to activate a word line of a memory cell. The word line of an activated memory cell corresponds to a predetermined refresh address, which is output from an internal address counter (not shown). The memory control circuit 27 further receives a test signal test from a test circuit (not shown) to conduct a test in a test mode in accordance with the test signal test.

Figure 2:
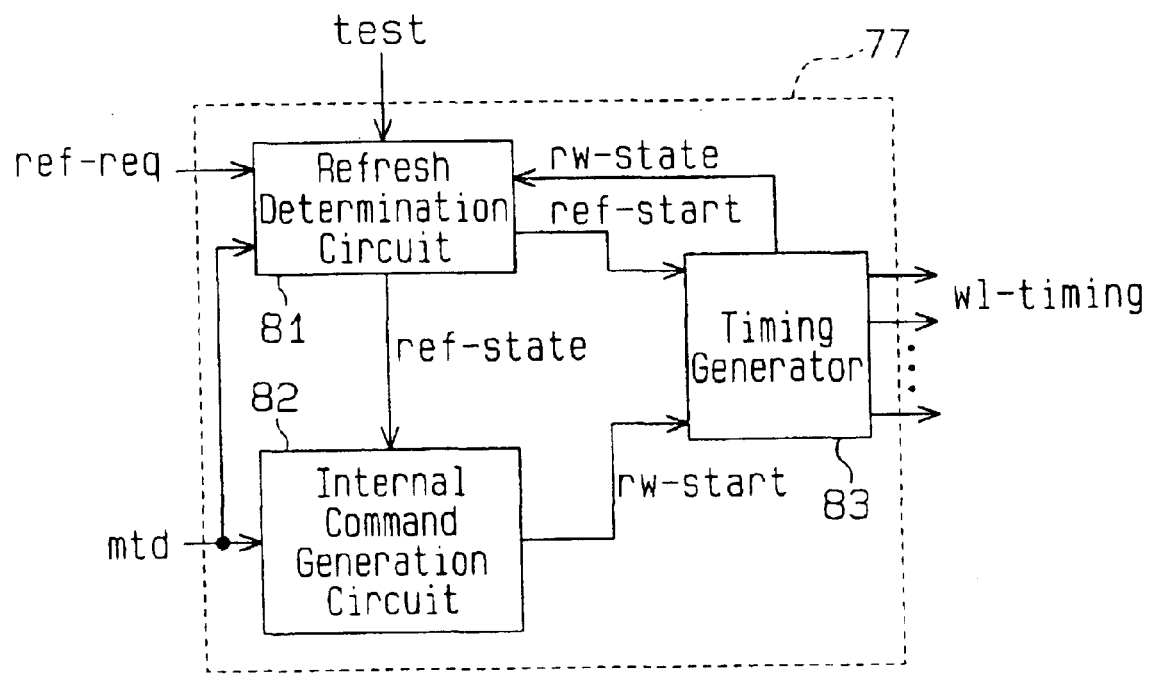
FIG. 2 is a schematic block circuit diagram of a memory control circuit incorporated in the semiconductor memory device of FIG. 1.
Figure 3:
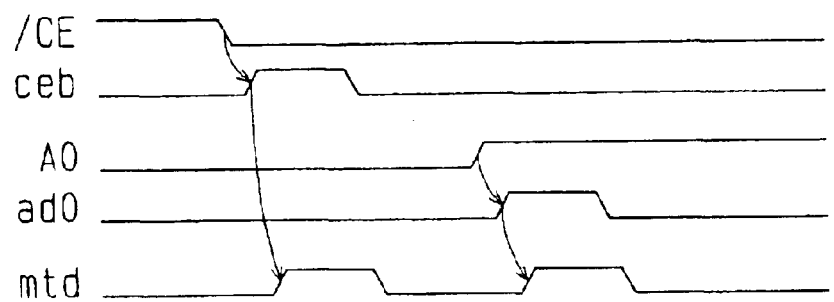
FIG. 3 is a waveform chart illustrating the operation principle of a transition detector of the semiconductor memory device of FIG. 1.
Figure 4:
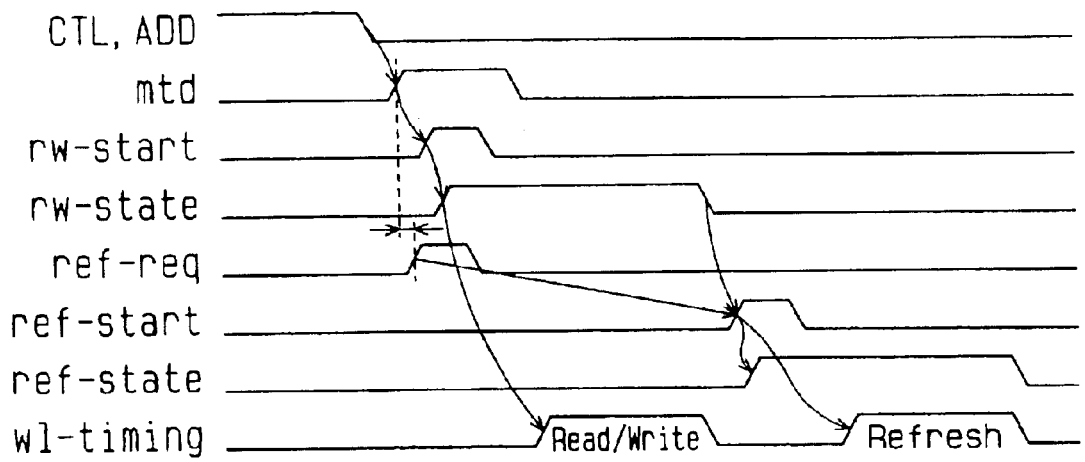
FIGS. 4 and 5 are waveform charts illustrating the operation principle of the memory control circuit of FIG. 2.
Figure 5:
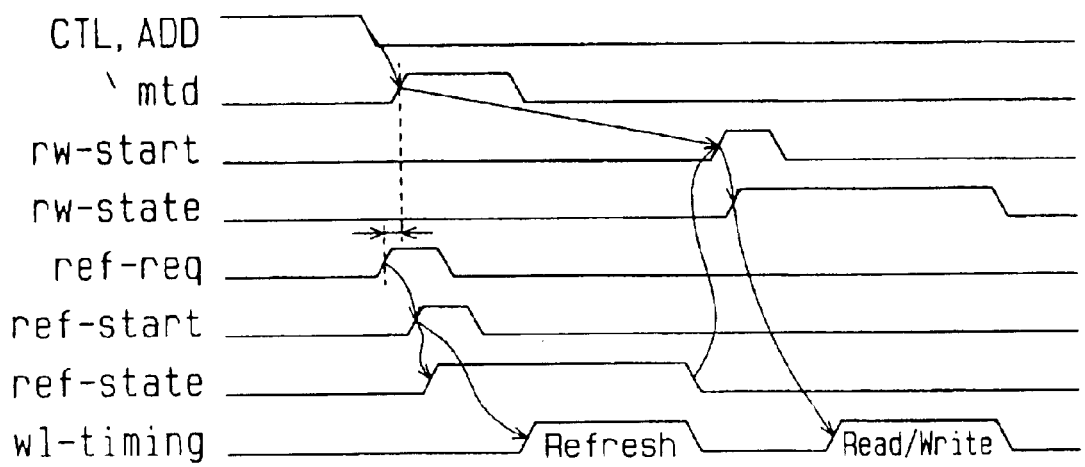
Figure 6:
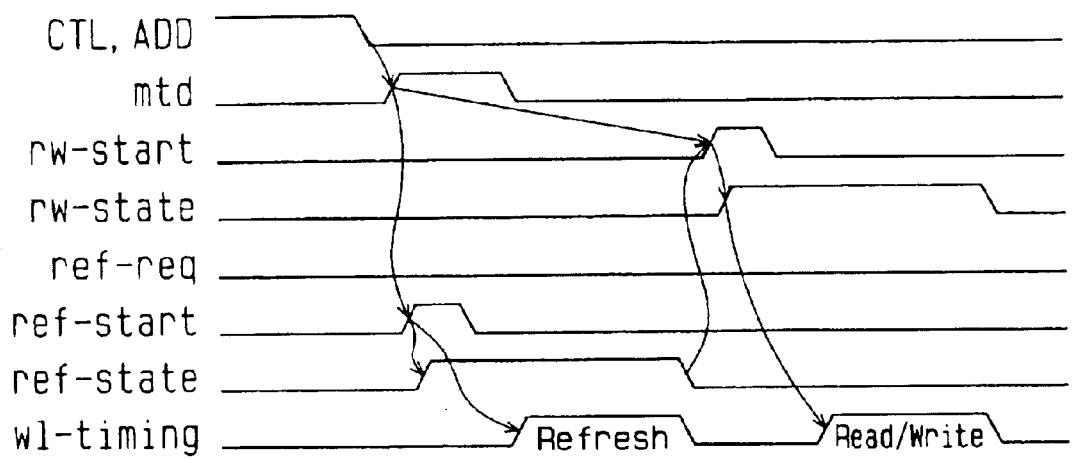
FIG. 6 is a waveform chart illustrating a test mode of the semiconductor memory device of FIG. 1.
Figure 7:
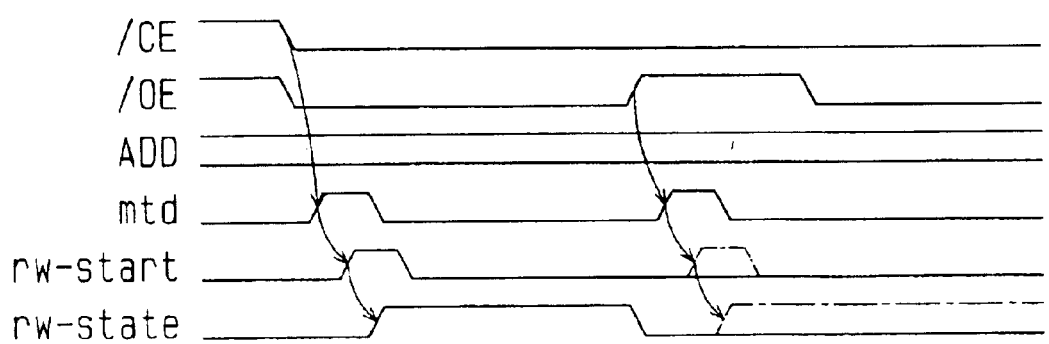
FIG. 7 is a waveform chart illustrating an example of a deficient mode of the semiconductor memory device of FIG. 1.
Figure 8:
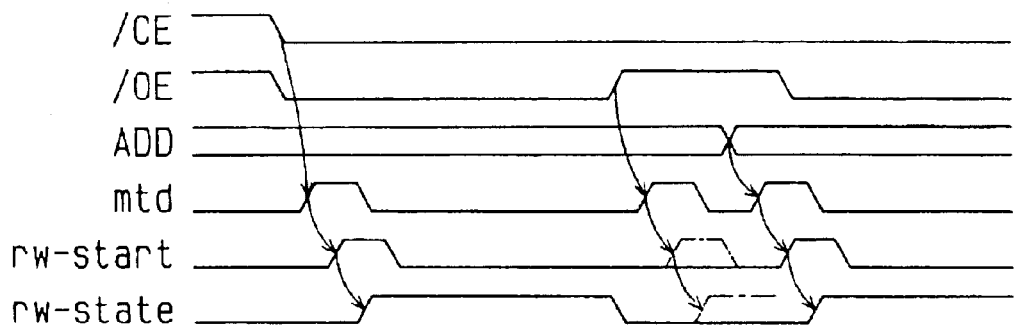
FIG. 8 is a waveform chart illustrating an example of an operation pattern in the prior art.

The configuration of the memory control circuit 27 is similar to that of the memory control circuit 77 of FIG. 2 and includes a refresh determination circuit 81, an internal command generation circuit (mode trigger generation circuit) 82, and a timing generator (signal generation circuit) 83. For the sake of brevity, elements used in the memory control circuit 77 will not be described below.

In the first embodiment, the refresh determination circuit 81 receives the refresh request signal ref-req from the refresh timer 28 and the transition detection signal mtds from the pulse synthesizing circuit 26. The refresh determination circuit 81 determines the input timing of the refresh request signal ref-req and the transition detection signal mtds, which are asynchronously input, to determine the level of priority of the refresh operation and the read/write operation. In accordance with the priority level, the refresh determination circuit 81 generates a refresh start signal ref-start (second mode trigger signal).

In this state, the refresh determination circuit 81 receives the test signal test from the test circuit. When receiving the transition detection signal mtds, the refresh determination circuit generates a refresh start signal ref-start in response to a transition detection signal mtds.

Figure 15:
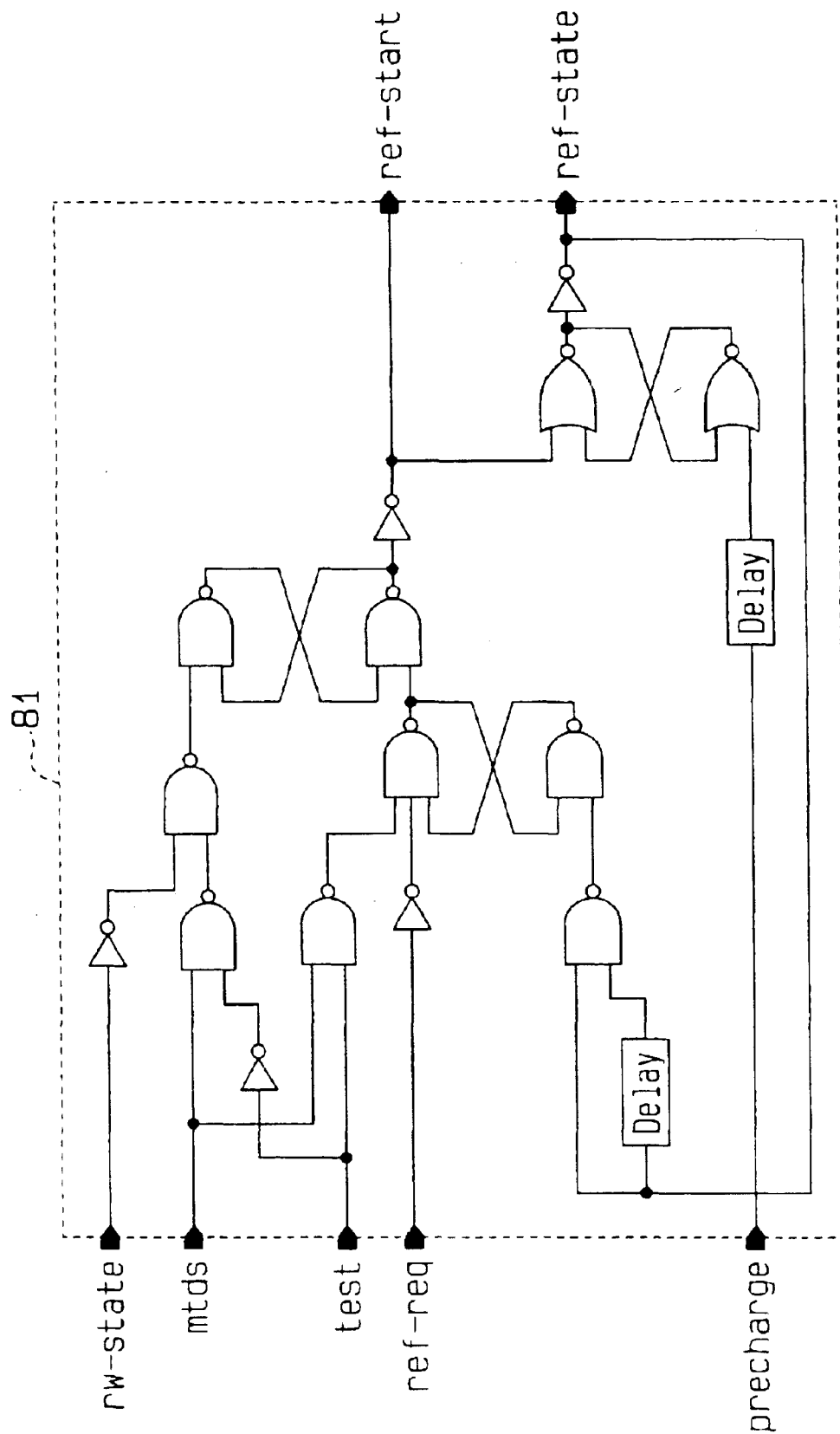
FIG. 15 is a schematic circuit diagram of a refresh determination circuit in the semiconductor memory device of FIG. 13.

FIG. 15 shows an example of the refresh determination circuit 81, which receives the transition detection signal mtds generated in accordance with the pulse generation control code en-code.

The internal command generation circuit 82 receives the transition detection signal mtds from the pulse synthesizing circuit 26. The internal command generation circuit 82 generates the read/write start signal rw-start (first mode trigger signal) in response to the transition detection signal mtds.

The timing generator 83 receives the refresh start signal ref-start from the refresh determination circuit 81 and the read/write start signal rw-start from the internal command generation circuit 82. The timing generator 83 generates the word line activation timing signal wl-timing (internal operation signal) in correspondence with each of the signals ref-start and rw-start.

Figure 14:
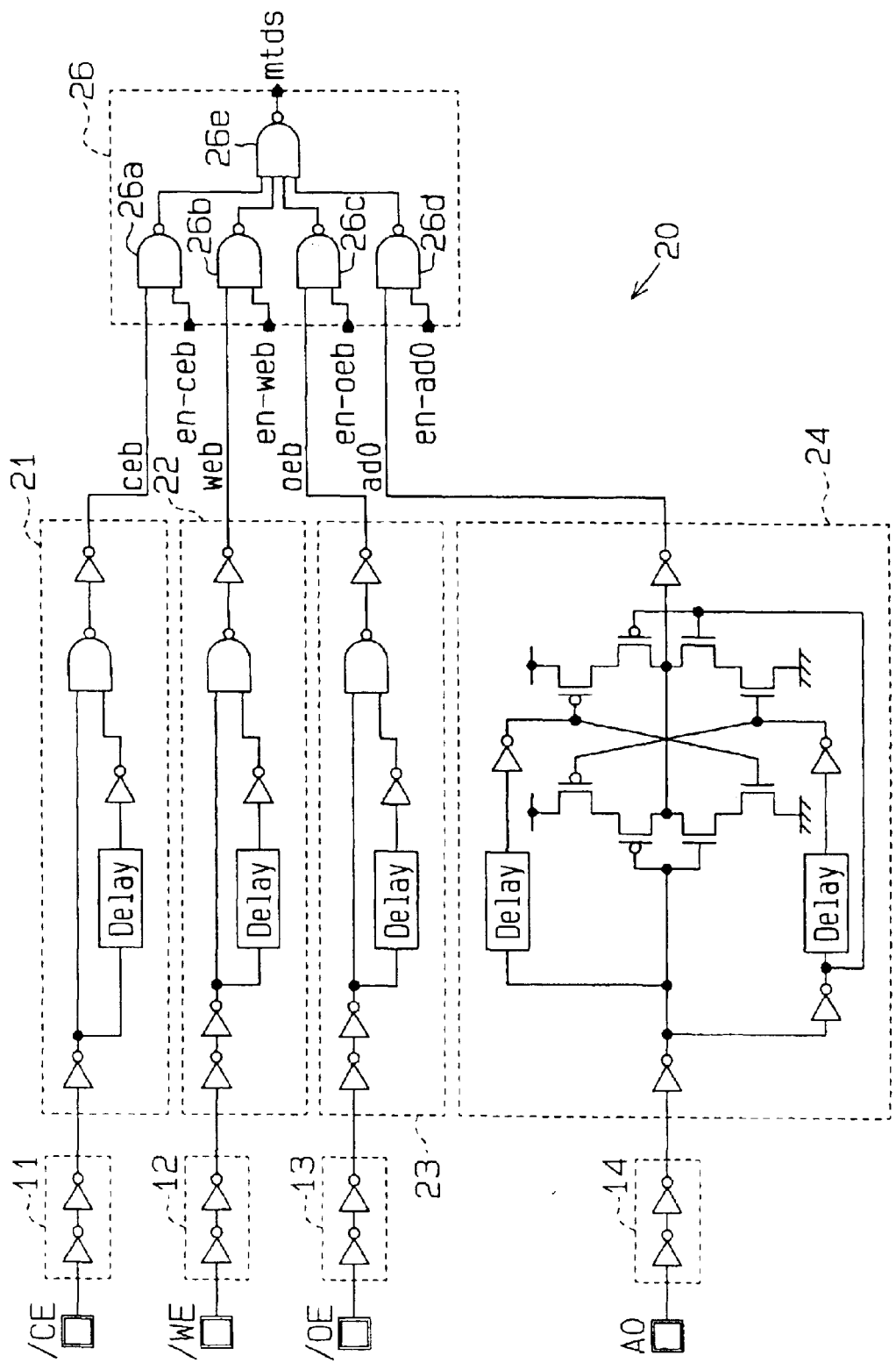
FIG. 14 is a schematic circuit diagram of a transition detector in the semiconductor memory device of FIG. 13.

FIG. 14 is a schematic circuit diagram illustrating an example of the transition detection signal generation circuit 20.

For example, when the chip enable signal /CE goes low, the transition detector 21 generates a one shot pulse, the pulse width of which depends on the delay time of a delay circuit. The transition detectors 22 and 23 generate a one shot pulse when the write enable signal /WE and the output enable signal /OE go high, respectively.

The transition detector 24 generates a one shot pulse when the address signal A0 goes high or low. Transition detectors including the transition detector 25 that detect changes in address signals have the same configuration as the transition detector 24.

The pulse synthesizing circuit 26 includes, for example, a plurality of signal selection circuits (in FIG. 14, NAND circuits 26a, 26b, 26c, and 26d) and a signal synthesizing circuit (in FIG. 14, a NAND circuit 26e). The signal selection circuits 26a to 26d are respectively provided for the transition detectors 21 to 24. The signal synthesizing circuit 26e logically synthesizes the output signals of the signal selection circuits and outputs the logically synthesized signal.

More specifically, the NAND circuits 26a–26d respectively receive the detection signals ceb, web, oeb, and ad0 from the transition detectors 21 to 24 and pulse generation control codes en-code (in FIG. 14, en-ceb, en-web, en-oeb, and en-ad0), which include the corresponding code information.

For example, when the pulse generation control code en-ceb goes low, the NAND circuit 26a invalidates the detection signal ceb of the transition detector 21. That is, when the NAND circuit 26a receives the low pulse generation control code en-ceb, the output of the NAND circuit 26a is fixed at a high level. In the same manner, when the pulse generation control codes en-web, en-oeb, en-ad0 go low, the NAND circuits 26b to 26d respectively invalidate the detection signals web, oeb, and ad0 from the transition detectors 22 to 24.

In this manner, the pulse synthesizing circuit 26 logically synthesizes the detections signals ceb, web, oeb, and ad0 in a selective manner in accordance with the pulse generation control code to generate the transition detection signal mtds.

Figure 16:
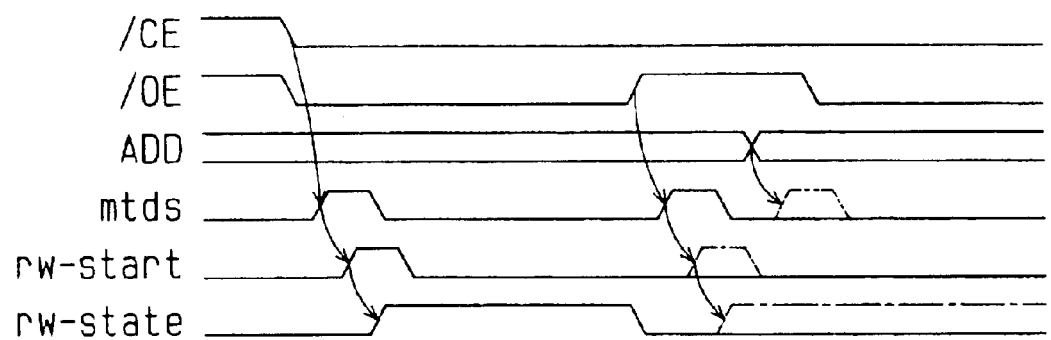
FIG. 16 is a waveform diagram illustrating deficient mode detection in the first embodiment.

The operation of the DRAM 100 in the first embodiment will now be discussed. FIG. 16 is a waveform chart illustrating an example in which a deficient mode is detected.

In the example of FIG. 16, the transition detection signal mtds is generated when the chip enable signal /CE goes low and the output enable signal /OE goes high, and the transition detection signal mtds is not generated when the external address signals ADD (A0, A1) change. That is, in the transition detection signal generation circuit 20, the address detection signals ad0 and ad1, which are provided to the pulse synthesizing circuit 26, are invalidated by the pulse generation control code en-code.

In FIG. 16, the transition detection signal mtds is generated when the chip enable signal /CE goes low. The read/write start signal rw-start and the read/write state signal rw-state are generated in accordance with the transition detection signal mtds to perform the read/write operation.

Then, the transition detection signal mtds is generated when the output enable signal /OE goes high. In this state, when an operational delay occurs in the device due to noise, process fluctuation, temperature fluctuation, and insufficient voltage margin, the read/write operation cannot be entered in the next cycle. In other words, the read/write start signal rw-start and the read/write state signal rw-state are not generated (the single-dot broken lines in FIG. 16 indicate normal operation).

After the output enable signal /OE goes high, the external address signal ADD (address value) changes. However, the address detection signals ad1 and ad1 are invalidated by the pulse generation control code en-code. That is, the transition detection signal mtds (double-dot broken lines in FIG. 16) is not generated even if the external address signal ADD changes. Thus, the read/write start signal rw-start and the read/write state signal rw-state are not generated.

Accordingly, even if such a deficient mode exists (deficiency in which a read/write operation that should be performed is not performed), the recurrence of an operation pattern in a deficient mode is enabled in the first embodiment. Thus, a deficiency of the device is accurately detected. When the control signals shift, the generation of the transition detection signal mtds may be stopped to detect the existence of a deficient mode.

Figure 17:
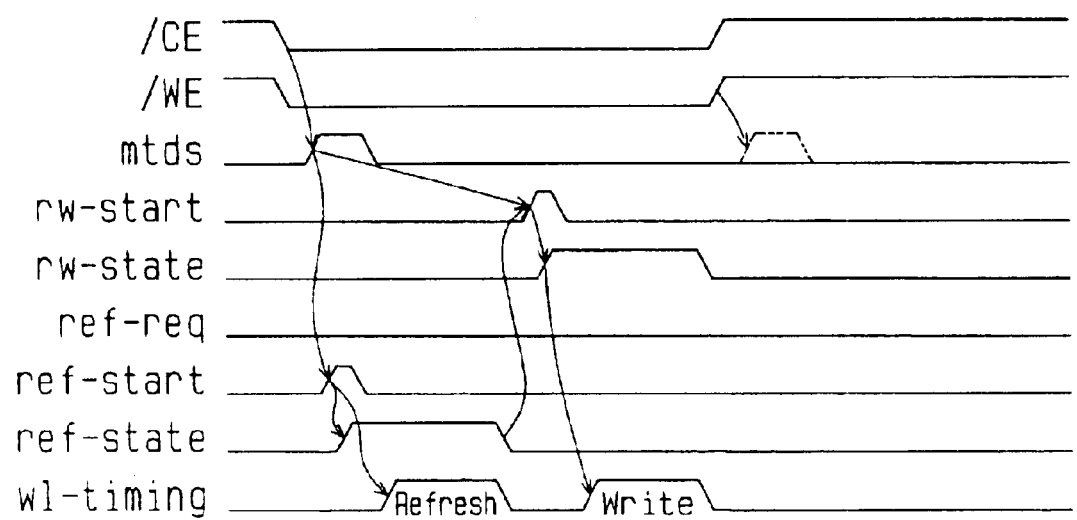
FIG. 17 is a waveform diagram illustrating a test mode in the first embodiment.

FIG. 17 is a waveform chart illustrating an example of the test mode. In the example of FIG. 17, the operation pattern when the write operation is performed after the refresh operation (worst pattern) is repeated in the test mode (refer to FIG. 9). In this example, the pulse generation control code en-code inhibits the generation of the transition detection signal mtds when the write enable signal /WE goes high.

The transition detection signal mtds is generated when the chip enable signal /CE goes low. The transition detection signal mtds generates the refresh start signal ref-start and starts the refresh operation. When the refresh operation is completed, the read/write start signal rw-start (more specifically, the write start signal) is generated in accordance with the transition detection signal mtds, which functions as a trigger that starts the refresh operation. The read/write start signal rw-start starts the write operation.

After the write operation is completed, the write enable signal /WE goes high. In this state, the pulse generation control code en-code invalidates the detection signal web of the transition detector 22. That is, the transition detection signal mtds (double-dot broken lines in FIG. 17) is not generated even if the write enable signal /WE is shifted. Thus, the refresh start signal ref-start is not generated, and the refresh operation is not performed.

Figure 9:
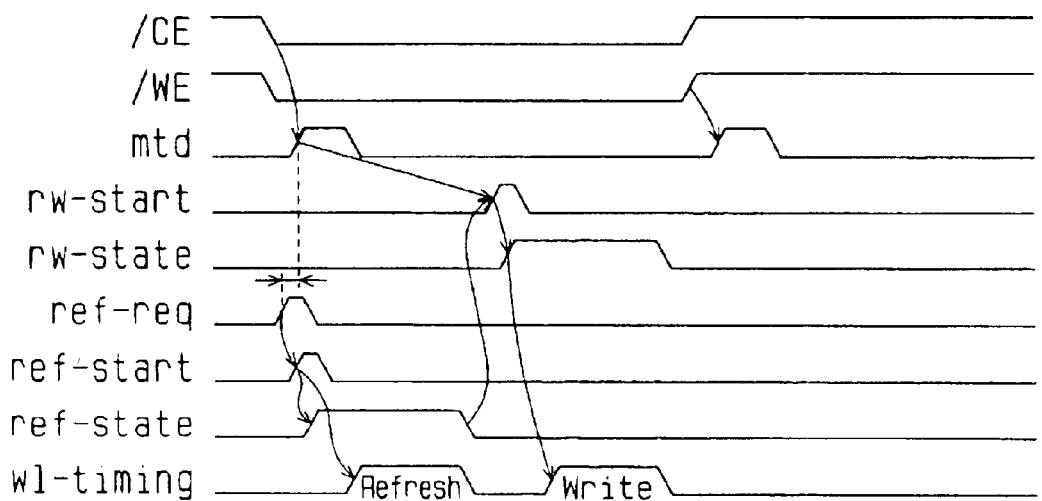
FIG. 9 is a waveform chart illustrating an example of an operation pattern in the prior art.
Figure 10:
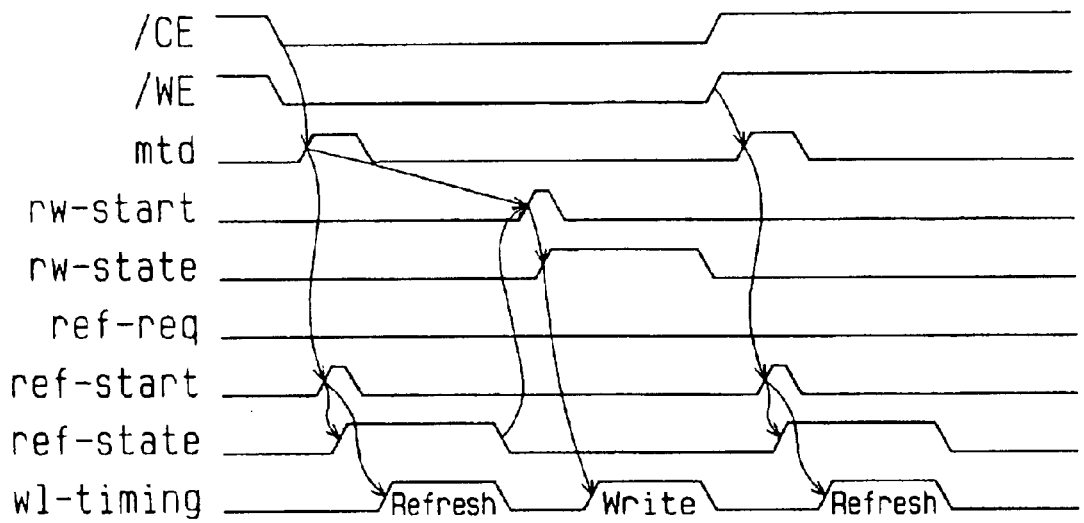
FIG. 10 is a waveform chart illustrating a prior art test mode for the operation pattern of FIG. 9.

In the first embodiment, the refresh operation is performed only, for example, when the chip enable signal /CE goes low in accordance with the pulse generation control code en-code. Accordingly, in the test mode, an unintentional refresh operation is not performed and the worst pattern of FIG. 9 is simulated and repeated. Thus, the desired pattern, such as the worst pattern, is repeated in the test mode and the device evaluation is accurately performed.

The DRAM 100 of the first embodiment has the advantages described below.

(1) The pulse synthesizing circuit 26 generates the transition detection signal mtds by logically synthesizing the input detection signals ceb, web, and oeb and the address detection signals ad0 and ad1 in accordance with the pulse generation control code en-code in a selective manner. This enables facilitated and accurate detection of the existence of a deficient mode.

(2) When performing the test mode, the pulse synthesizing circuit 26 generates the transition detection signal mtds by logically synthesizing the detection signals ceb, web, oeb, ad0, and ad1 in accordance with the pulse generation control code en-code in a selective manner. This prevents an unnecessary refresh operation from being performed. Thus, the desired pattern, such as the worst pattern, is simulated and repeated. Accordingly, the device evaluation is performed more accurately.

(3) The pulse generation control code en-code controls the transition detection signal mtds, which is generated by the pulse synthesizing circuit 26. Thus, the circuit scale is not increased from the prior art configuration.

Figure 18:
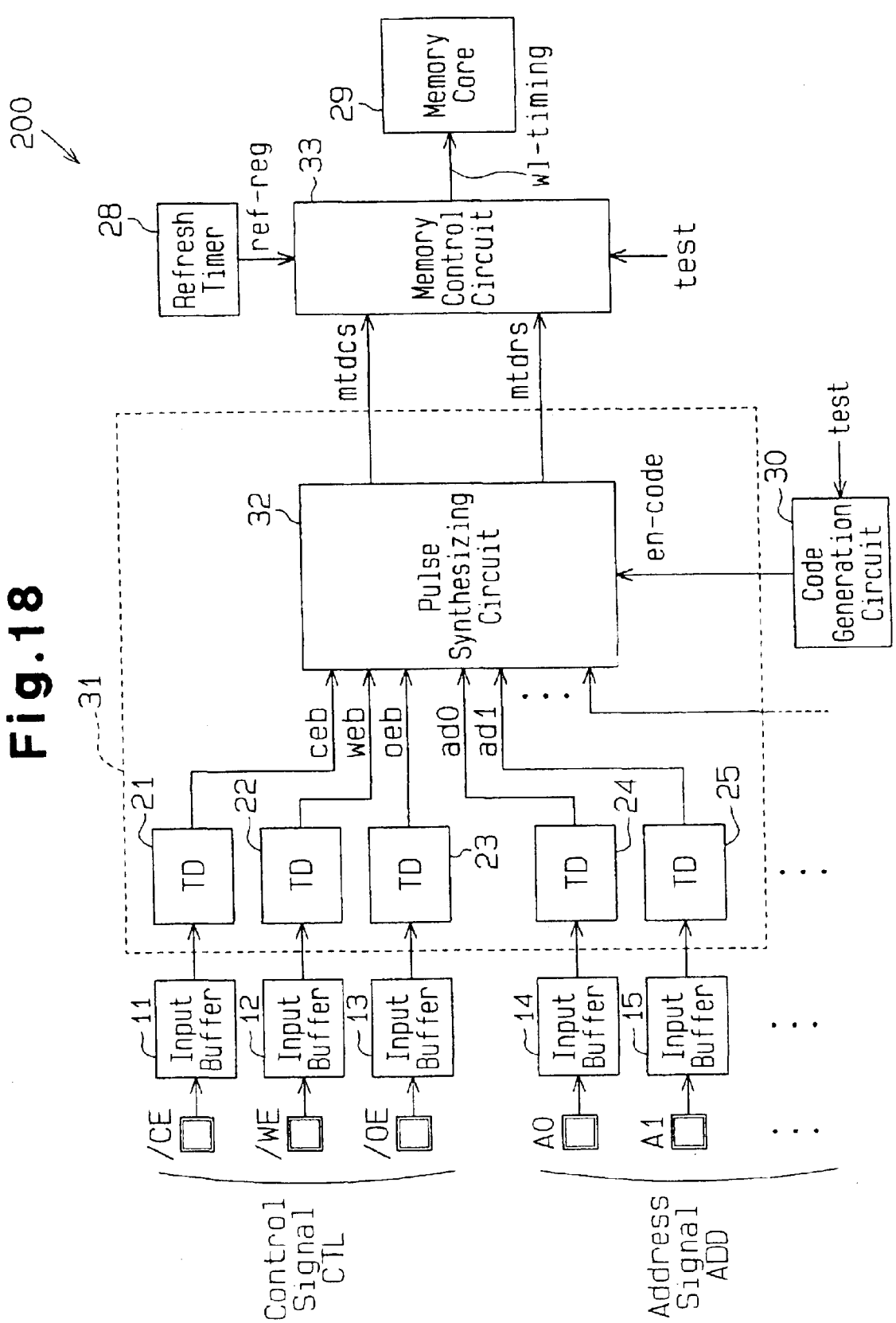
FIG. 18 is a schematic block circuit diagram of a semiconductor memory device according to a second embodiment of the present invention.

FIG. 18 is a block circuit diagram of an input circuit section of a semiconductor memory device (DRAM) 200 according to a second embodiment of the present invention. In the DRAM 200 of the second embodiment, the pulse synthesizing circuit 26 and the memory control circuit 27 in the transition detection signal generation circuit 20 of the first embodiment are partially modified.

In the second embodiment, a transition detection signal generation circuit 31 includes a plurality of (in FIG. 18, five) transition detectors 21 to 25 and a pulse synthesizing circuit 32.

The pulse synthesizing circuit 32 uses detection signals ceb, web, oeb, ad0, and ad1 of the transition detectors 21 to 25 to generate a command transition detection signal mtdcs (first entry signal) and a refresh transition detection signal mtdrs (second or third entry signal). More specifically, the pulse synthesizing circuit 32 logically synthesizes the detection signals ceb, web, oeb, ad0, and ad1 in a selective manner in accordance with the pulse generation control code en-code to generate the command transition detection signal mtdcs and the refresh transition detection signal mtdrs.

Figure 19:
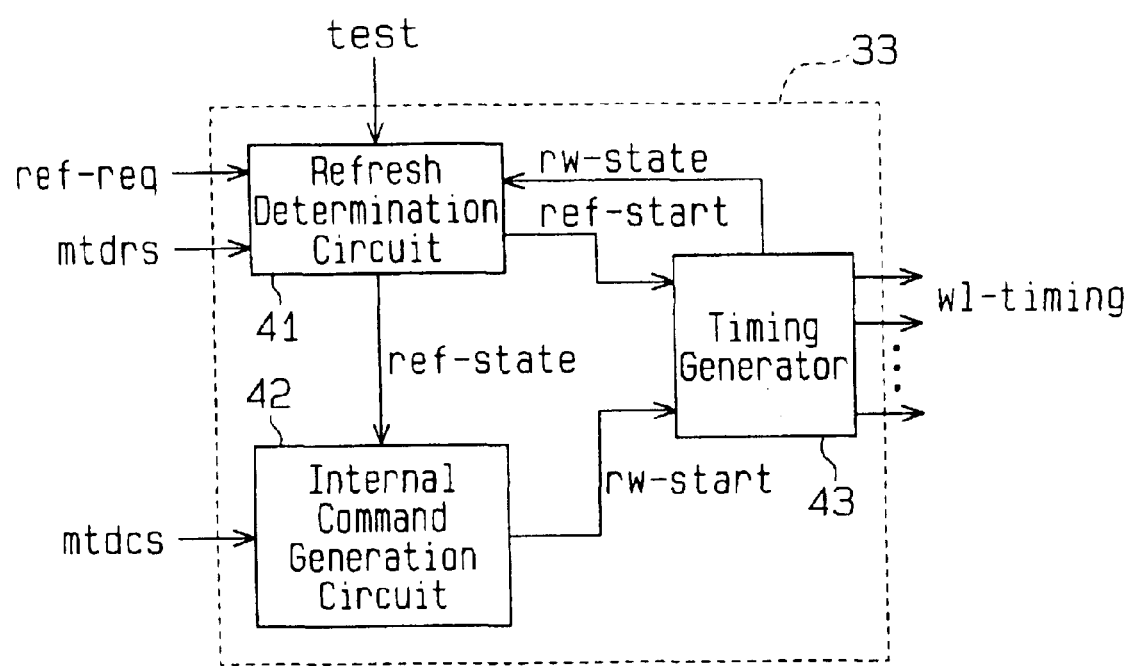
FIG. 19 is a schematic block circuit diagram of a memory control circuit of the semiconductor memory device of FIG. 18.

FIG. 19 is a schematic block circuit diagram of the memory control circuit 33 of FIG. 18. The memory control circuit 33 includes a refresh determination circuit 41, an internal command generation circuit (mode trigger generation circuit) 42, and a timing generator (internal operation signal generation circuit) 43.

The refresh determination circuit 41 receives the refresh transition detection signal mtdrs from the pulse synthesizing circuit 32, the refresh request signal ref-req from the refresh timer 28, and the test signal test from a test circuit (not shown).

When there is more than one request, the refresh determination circuit 41 determines the priority level of the refresh operation and the read/write operation from the input timing of the refresh request signal ref-req and the transition detection signal mtdrs, which are asynchronously input.

More specifically, the refresh determination circuit 41 generates the refresh start signal ref-start and the refresh state signal ref-state in response to the refresh request signal ref-req. When receiving the transition detection signal mtdrs before the refresh request signal ref-req, the refresh determination circuit 41 generates the refresh start signal ref-req and the refresh state signal ref-state after the read/write state signal rw-state are reset.

The internal command generation circuit 42 receives the transition detection signal mtdcs from the pulse synthesizing circuit 32. In response to the transition detection signal mtdcs, the internal command generation circuit 42 generates the read/write start signal rw-start. When receiving the refresh state signal ref-state from the refresh determination circuit 41, the internal command generation circuit 42 generates the read/write start signal rw-start after the refresh state signal ref-state is reset.

The timing generator 43 receives the refresh start signal ref-start from the refresh determination circuit 41 and the read/write start signal rw-start from the internal command generation circuit 42. The timing generator 43 generates the word line activation timing signal wl-timing, which activates the word line corresponding to a predetermined refresh address, in response to the refresh start signal ref-start. The activated word line corresponds to the predetermined refresh address generated by an internal address counter (not shown).

In response to the read/write start signal rw-start, the timing generator 43 generates the read/write state signal rw-state and the word line activation timing signal wl-timing, which activates a word line. The activated word line corresponds to a predetermined read/write address assigned by the external address signal ADD.

In addition to the word line activation timing signal wl-timing, the timing generator 43 generates various internal operation signals including a sense amplifier activation timing signal, which activates a sense amplifier. Only the word line activation timing signal wl-timing will be discussed below.

Figure 20:
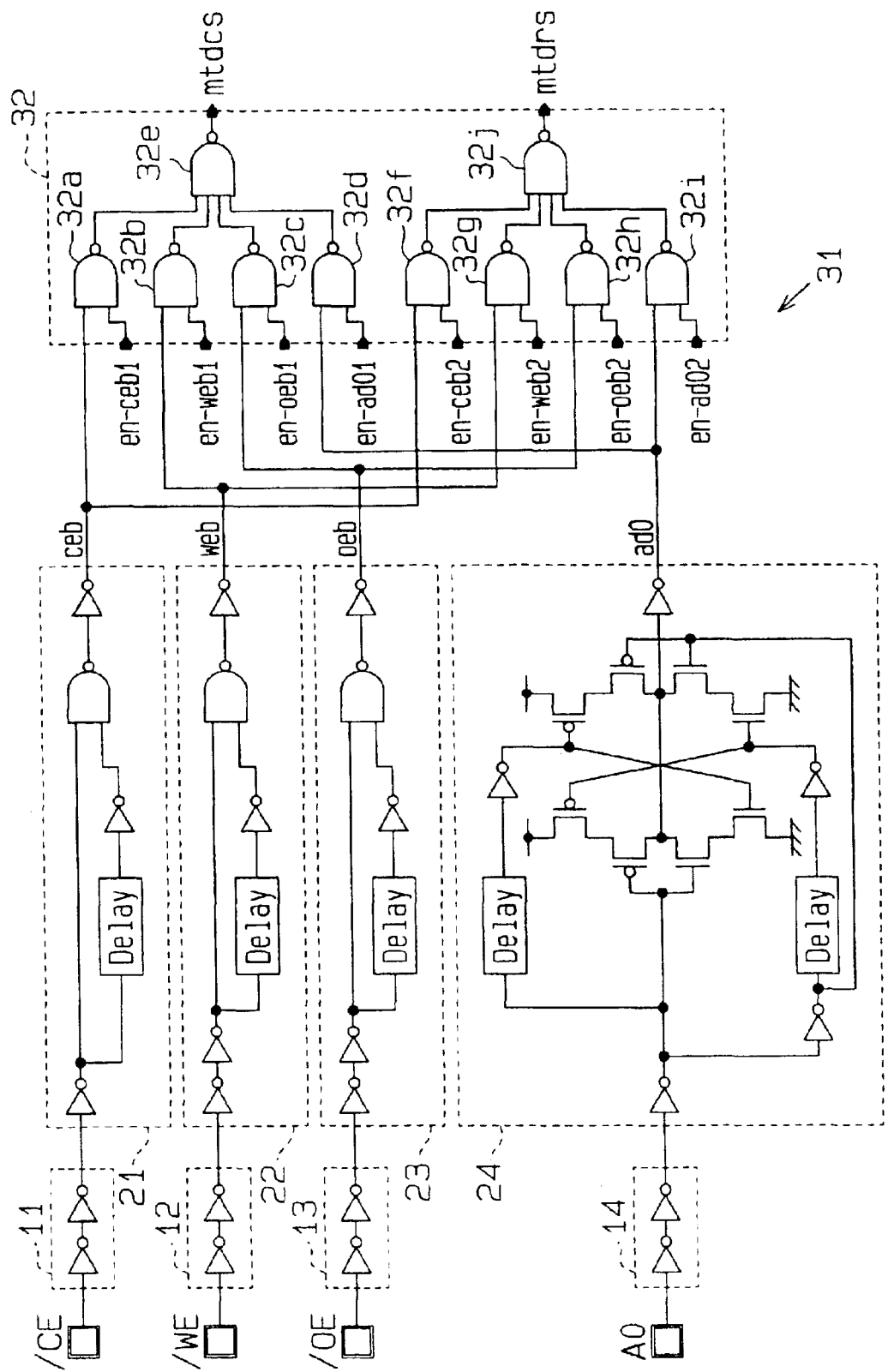
FIG. 20 is a schematic circuit diagram of a transition detector in the semiconductor memory device of FIG. 18.

FIG. 20 is a circuit diagram showing an example of the transition detection signal generation circuit 31. The pulse synthesizing circuit 32 includes a plurality of signal selection circuits (NAND circuits 32a to 32d), which generate the command transition detection signal mtdcs, and a signal synthesizing circuit (NAND circuit 32e). Further, the pulse synthesizing circuit 32 includes a plurality of signal selection circuits (NAND circuits 32f to 32i), which generate the refresh transition detection signal mtdrs, and a signal synthesizing circuit (NAND circuit 32j).

The signal selection circuits are provided in correspondence with each transition detector of the transition detection signal generation circuit 31. In FIG. 20, for the sake of brevity, the NAND circuits 32a to 32d and 32f to 32i are shown corresponding to the transition detectors 21 to 24, respectively.

The NAND circuits 32a–32d respectively receive the detection signals ceb, web, oeb, and ad0 from the transition detectors 21 to 24 and pulse generation control codes en-code (en-ceb1, en-web1, en-oeb1, and en-ad01), which include the corresponding code information.

For example, when the pulse generation control code en-ceb1 goes low, the NAND circuit 32a invalidates the detection signal ceb of the transition detector 21. That is, when the NAND circuit 32a receives the low pulse generation control code en-ceb1, the output of the NAND circuit 32a is fixed at a high level. In the same manner, when the pulse generation control codes en-web1, en-oeb1, and en-ad01 go low, the NAND circuits 32b to 32d respectively invalidate the detection signals web, oeb, and ad0 from the transition detectors 22 to 24.

The NAND circuits 32f–32i respectively receive the detection signals ceb, web, oeb, and ad0 from the transition detectors 21 to 24 and pulse generation control codes en-code (en-ceb2, en-web2, en-oeb2, and en-ad02), which include the corresponding code information. For example, when the pulse generation control codes en-ceb2, en-web2, en-oeb2, en-ad02 go low, the associated NAND circuits 32f to 32i respectively invalidate the detection signals ceb, web, oeb, and ad0 from the transition detectors 21 to 24.

The pulse synthesizing circuit 32 logically synthesizes the detection signals ceb, web, oeb, and ad0 in a selective manner in accordance with the pulse generation control codes en-code (en-ceb1, en-web1, en-oeb1, en-ad01, en-ceb2, en-web2, en-oeb2, and en-ad02) to generate the command transition detection signal mtdcs and the refresh transition detection signal mtdrs.

Figure 22:
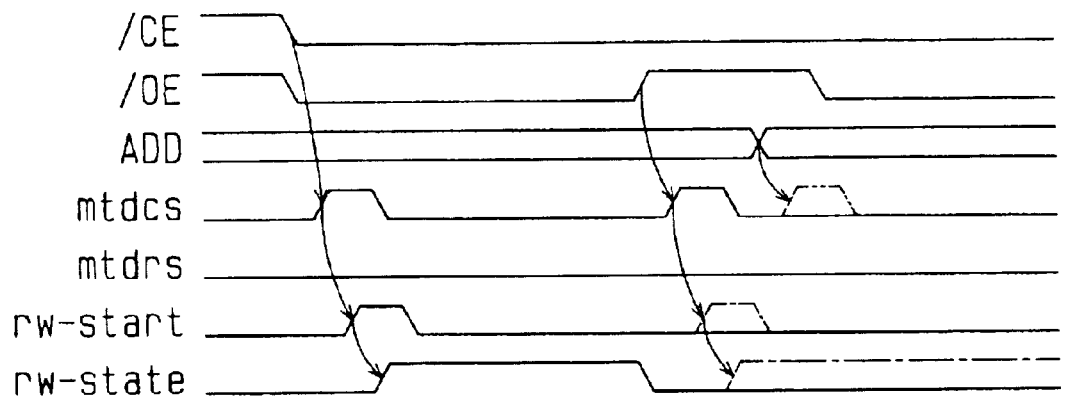
FIG. 22 is a waveform diagram illustrating deficient mode detection in the second embodiment.

The operation of the DRAM 200 will now be discussed. FIG. 22 is a waveform chart illustrating an example in which a deficient mode is detected. FIG. 22 illustrates an example in which the transition detection signal mtdcs is not generated in accordance with changes in the external address signal ADD (A0 and A1). In this case, the pulse generation control code en-code invalidates the detection signals ad0 and ad1 input to the pulse synthesizing circuit 32.

Further, the refresh transition detection signal mtdrs is not generated when one of the chip enable signal /CE, the output enable signal /OE, and the external address signal ADD (A0 and A1) shifts levels. In this case, the pulse generation control code en-code invalidates the detection signals ceb, web, oeb, ad0, and ad1.

When the chip enable signal /CE goes low, the command transition detection signal mtdcs is generated, and the read/write start signal rw-start and the read/write state signal rw-state are generated in accordance with the detection signal mtdcs. This performs the read/write operation.

Then, the command transition detection signal mtdcs is generated when the output enable signal /OE goes high. In this state, when an operational delay occurs in the device, the read/write operation cannot be entered in the next cycle. That is, when an operational delay occurs, the read/write start signal rw-start and the read/write state signal rw-state, which are normally generated, are not generated (the single-dot broken lines in FIG. 22 indicate normal operation).

After the output enable signal /OE goes high, the external address signal ADD (address value) changes. However, the address detection signals ad0 and ad1 are invalidated by the pulse generation control code en-code. Thus, the command transition detection signal mtdcs (double-dot broken lines in FIG. 22) is not generated even if the external address signal ADD changes. As a result, the read/write start signal rw-start and the read/write state signal rw-state are not generated.

Accordingly, in the second embodiment, even if a deficient mode exists, the recurrence of an operation pattern in a deficient mode is enabled. Thus, a deficiency of the device is accurately detected. When the control signals CTL (/CE, /WE, /OE) shift levels, the generation of the command transition detection signal mtdcs may be stopped to detect the existence of a deficient mode.

Figure 23:
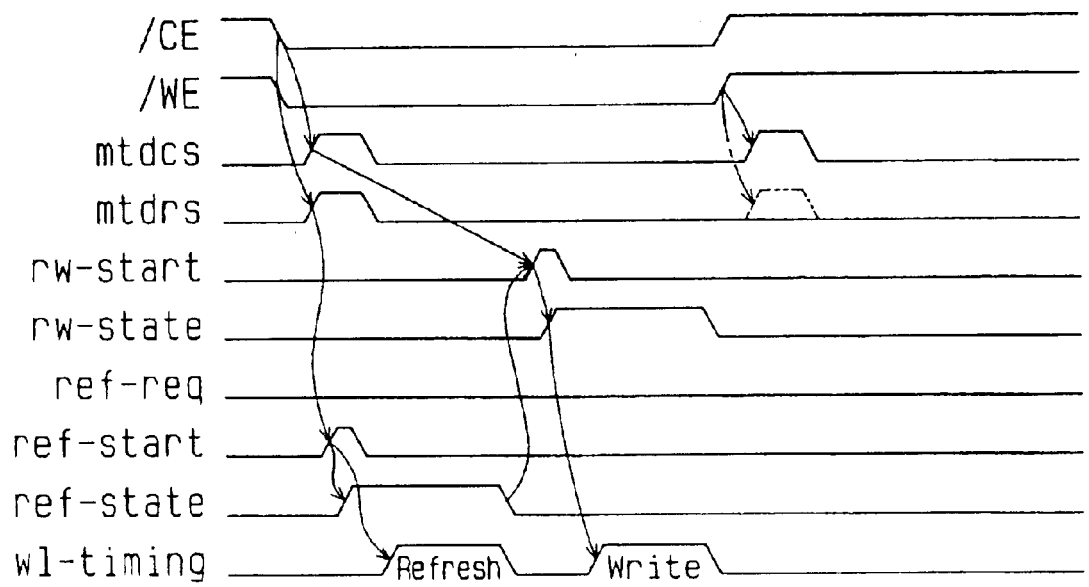
FIGS. 23 and 24 are waveform diagrams illustrating a test mode in the second embodiment.

FIG. 23 is a waveform chart illustrating an example of the test mode. In the example of FIG. 23, the worst pattern is repeated in the test mode (refer to FIG. 9). In the example of FIG. 23, the command transition detection signal mtdcs is generated when the chip enables signal /CE goes low or when the write enable signal /WE goes high. The refresh transition detection signal mtdrs is generated only when the chip enable signal /CE goes low. When the write enable signal /WE goes high, the pulse generation control code en-code inhibits the generation of the refresh transition detection signal mtdrs.

The transition detection signals mtdcs and mtdrs are generated when the chip enable signal /CE goes low, and the refresh start signal ref-start is generated (refresh operation is started) in accordance with the refresh transition detection signal mtdrs. When the refresh operation ends, the read/write start signal rw-start (more specifically, write start signal) is generated in accordance with the command transition detection signal mtdcs, which is generated when the chip enable signal /CE goes low, to start the write operation.

After the write operation ends, the write enable signal /WE goes high. Then, the pulse generation control code en-code invalidates the detection signal web of the transition detector 22. Thus, the refresh detection signal mtdrs (shown by double-dot broken lines in FIG. 23) is not generated even when the write enable signal /WE is shifted. As a result, the refresh start signal ref-start is not generated and the refresh operation is not performed.

In the second embodiment, the refresh operation is performed only when the chip enable signal /CE goes low. Accordingly, the worst pattern of FIG. 9 is simulated and repeated in the test mode, and the device is accurately evaluated.

Figure 11:
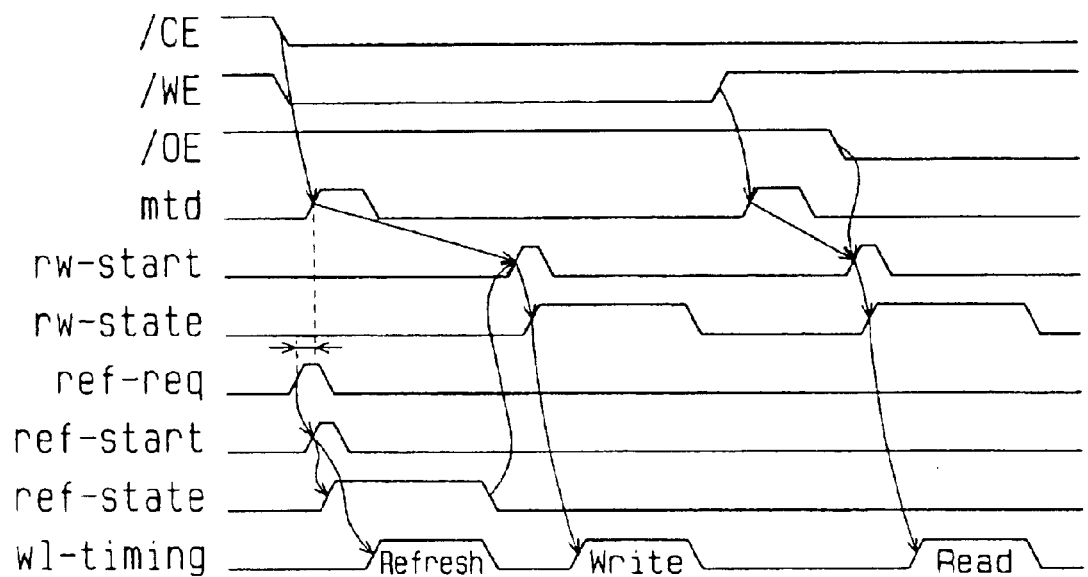
FIG. 11 is a waveform diagram illustrating an example of an operation pattern in the prior art.
Figure 12:
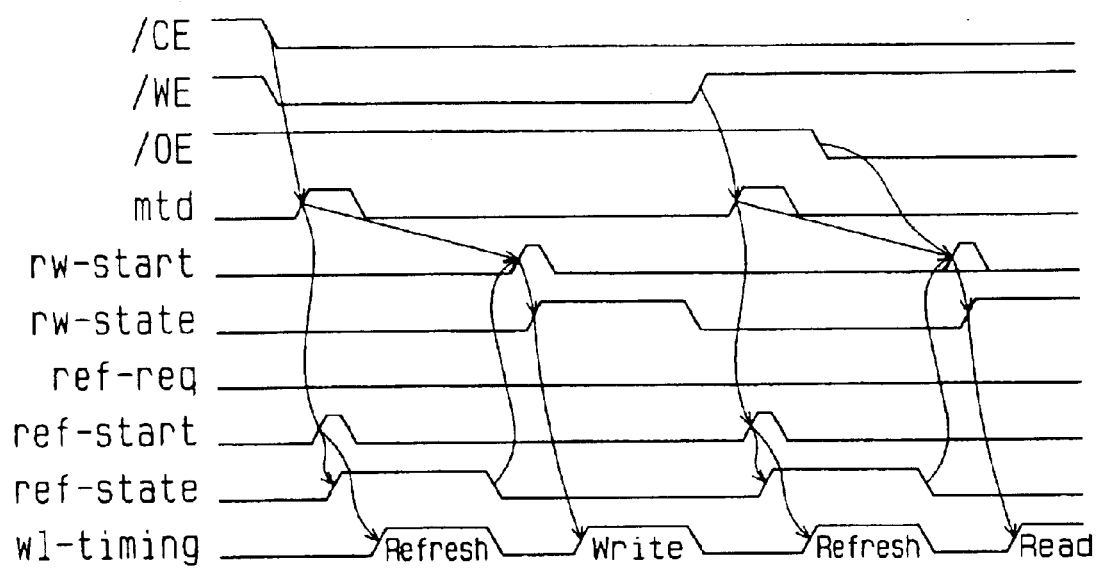
FIG. 12 is a waveform chart illustrating a prior art test mode for the operation pattern of FIG. 11.
Figure 24:
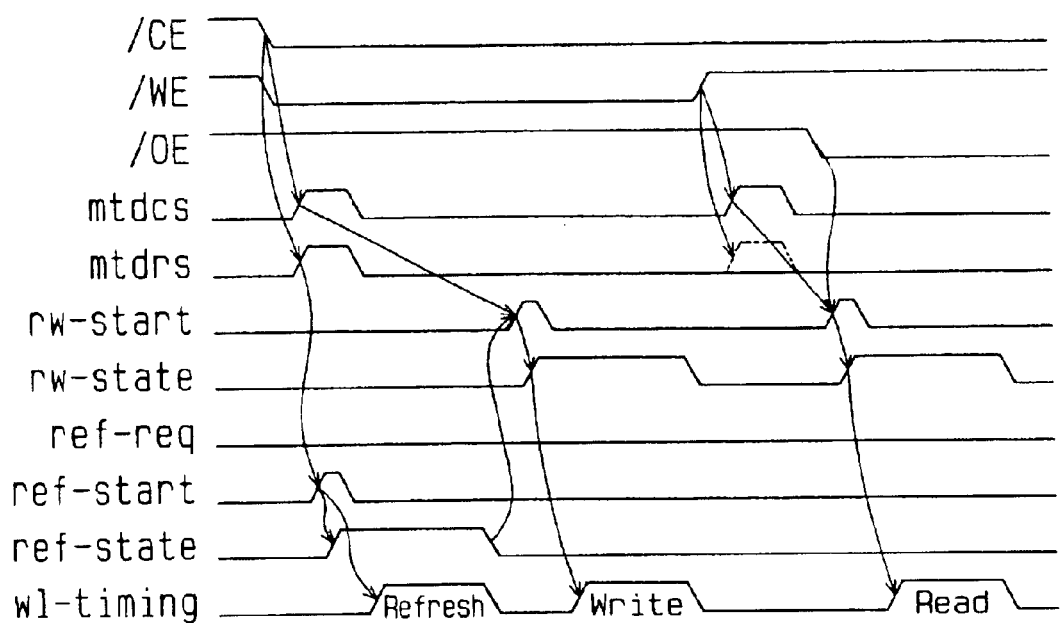

FIG. 24 is a waveform diagram illustrating a further example of a test mode. FIG. 24 shows an example of the worst pattern in which the read operation is performed after the write operation is completed. The worst pattern is repeated in the test mode (refer to FIG. 11).

In FIG. 24, the command transition detection signal mtdcs, for example, is generated when the chip enable signal /CE goes low, when the write enable signal /WE goes high, or when the output enable signal /OE goes high (not shown). The refresh transition detection signal mtdrs is generated when the chip enable signal /CE goes low or when the output enable signal /OE goes high (not shown). The pulse generation control code en-code inhibits the generation of the refresh transition detection signal mtdrs when the write enable signal /WE goes high.

The transition detection signals mtdcs and mtdrs are generated when the chip enable signal /CE goes low, and the refresh start signal ref-start is generated (refresh operation is started) in accordance with the refresh transition detection signal mtdrs. When the refresh operation ends, the read/write start signal rw-start (more specifically, write start signal) is generated in accordance with the command transition detection signal mtdcs, which is generated when the chip enable signal /CE goes low, to start the write operation.

After the write operation ends, the write enable signal /WE goes high. In this state, the pulse generation control code en-code invalidates the detection signal web of the transition detector 22. Thus, the refresh detection signal mtdrs (shown by double-dot broken lines in FIG. 24) is not generated even when the write enable signal /WE is shifted. As a result, the refresh start signal ref-start is not generated and the refresh operation is not performed.

Then, when the output enable signal /OE goes low, the read/write start signal rw-start (more specifically, read start signal) is generated in accordance with the command transition detection signal mtdcs, which is generated when the write enable signal /WE goes high. The read operation is started in accordance with the start signal rw-start.

In the test mode of the second embodiment, the read operation is performed by the command transition detection signal mtdcs while inhibiting unnecessary refresh operations. Accordingly, the operating pattern of FIG. 11 (the write operation performed successively after the refresh operation when there is more than one access request at the same time and the read operation performed successively after the write operation) is simulated and repeated in the test mode.

The DRAM 200 of the second embodiment has the advantages described below.

(1) The pulse synthesizing circuit 32 logically synthesizes the detection signals ceb, web, oeb, ad0, and ad1 from the associated transition detector 21 to 25 in a selective manner in accordance with the pulse generation control code en-code to generate the command transition detection signal mtdcs and the refresh transition detection signal mtdrs. The command transition detection signal mtdcs is used to process an external access (read/write operation). The refresh transition detection signal mtdrs is used to process an internal access. Since unnecessary refresh operations are not performed in the test mode, the intended operating pattern (read/write operation) is performed in a desirable manner.

It should be apparent to those skilled in the art that the present invention may be embodied in many other specific forms without departing from the spirit or scope of the invention. Particularly, it should be understood that the present invention may be embodied in the following forms.

In each of the above embodiments, the worst pattern, in which the write operation is performed after the refresh operation, is repeated in the test mode. However, the worst pattern, in which the read operation is performed after the refresh operation, may be simulated and repeated in the test mode to evaluate a device.

In each of the above embodiments, the control signal CTL input from an external device is not restricted to the chip enable signal /CE, the write enable signal /WE, and the output enable signal /OE.

In each of the above embodiments, for the sake of brevity, only the address signals A0 and A1 are shown as the external address ADD in FIGS. 13 and 18. However, the external address signal ADD includes multiple bits.

In each of the above embodiments, the pulse generation control code en-code may be randomly accessed via an external terminal (exclusive test terminal or another terminal that is not used when a test is conducted) when a command is input. In such a case, the pulse generation control code en-code enables the masking of certain edges (rising or falling) of the detection signals ceb, web, oeb, ad0, and ad1, which are output from the transition detectors 21 to 25.

When evaluating a device, the signals that are logically synthesized in the pulse synthesizing circuits 26 and 32 may be changed when required to set the deficient mode existing in the device (DRAM).

In each of the embodiments, the operating patterns simulated and repeated in the test mode are only examples, and other operating patterns may be repeated in the test mode to evaluate a device.

The configuration of the transition detection signal generation circuit 20 in FIG. 14 and the configuration of the refresh determination circuit 81 in FIG. 15 are only examples. The present invention is not restricted to such examples.

Figure 21:
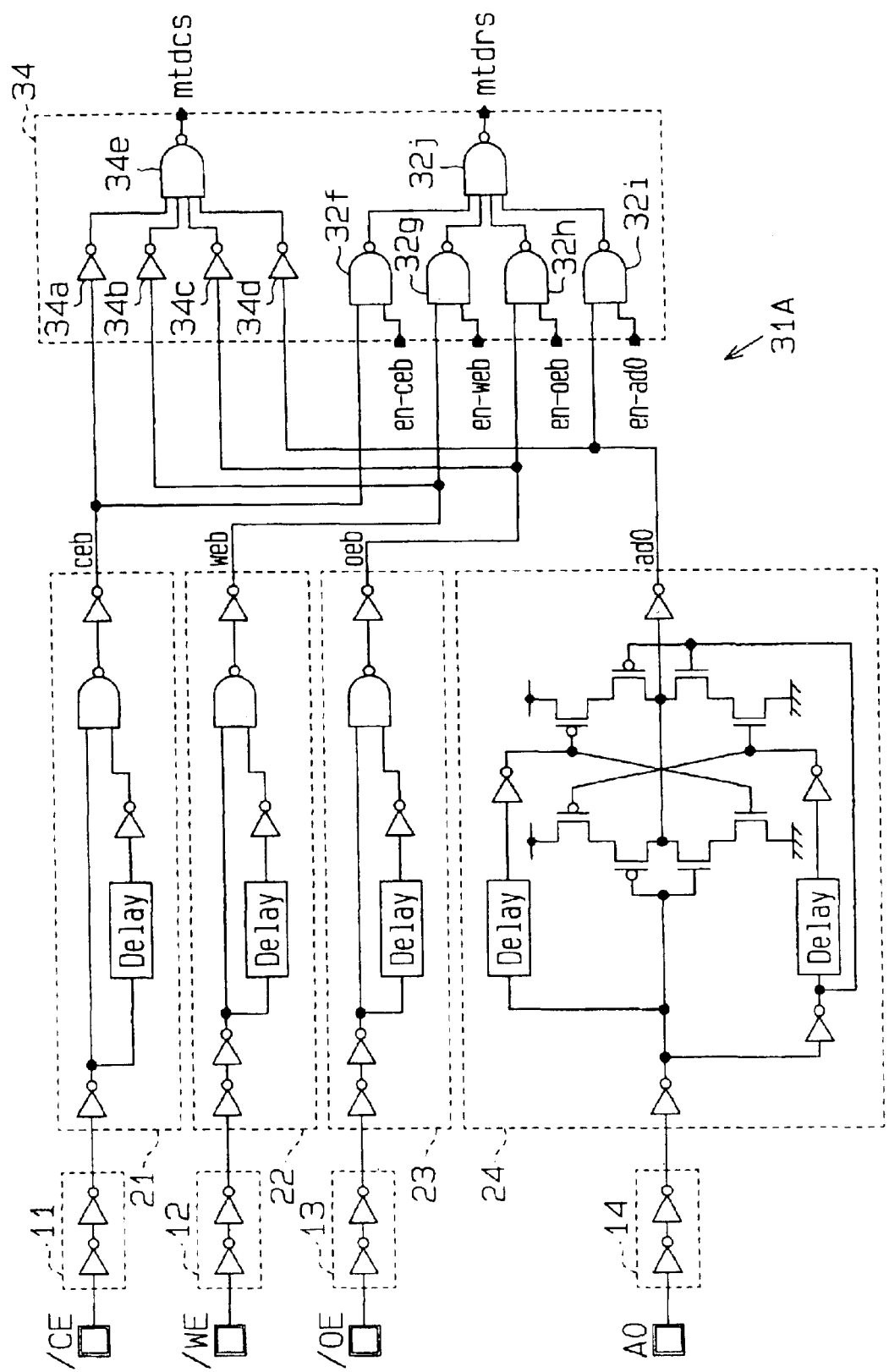
FIG. 21 is a schematic circuit diagram of a further transition detector in the semiconductor memory device of FIG. 18.

In the second embodiment, the transition detection signal generation circuit 31 of FIG. 20 may be replaced by a transition detection signal generation circuit 31, which is shown in FIG. 21. A pulse synthesizing circuit 34 is employed when evaluating a device in the test mode.

More specifically, the pulse synthesizing circuit 34 includes a plurality of inverter circuits 34a to 34d, which generate the command transition detection signal mtdcs, and a single signal synthesizing circuit (NAND circuit 34e). The pulse synthesizing circuit 34 includes a plurality of signal selection circuits (NAND circuits 32f to 32i), which generate the refresh transition detection signal mtdrs, and a single signal synthesizing circuit (NAND circuit 32j). The pulse synthesizing circuit 34 logically synthesizes the detection signals ceb, web, oeb, and ad0 in a selective manner in accordance with the pulse generation control code en-code (en-ceb, en-web, en-oeb, and en-ad0) to generate the refresh transition detection signal mtdrs.

The present examples and embodiments are to be considered as illustrative and not restrictive, and the invention is not to be limited to the details given herein, but may be modified within the scope and equivalence of the appended claims.

What is claimed is:

1. A semiconductor memory device comprising:
    first and second access modes and an entry signal generation circuit for logically synthesizing a plurality of input signals to generate a first entry signal used to enter the first access mode; and
    a control circuit connected to the entry signal generation circuit to generate a first mode trigger signal in response to the first entry signal, and when the control circuit receives a second entry signal to enter the second access mode, the control circuit generates a second mode trigger signal in response to the second entry signal;
    wherein the entry signal generation circuit logically synthesizes the input signals in a selective manner in accordance with a selection control signal to generate the first entry signal.

2. The semiconductor memory device according to claim 1, wherein the selection control signal includes code information related to the logically synthesized input signals.

3. The semiconductor memory device according to claim 1, further comprising a test mode, wherein the selection control signal is provided to the entry signal generation circuit in the test mode, which is conducted in accordance with a test signal.

4. The semiconductor memory device according to claim 1, wherein the entry signal generation circuit includes:
    a plurality of transition detectors, each detecting transition of an associated one of the input signals to generate a detection signal; and
    a pulse synthesizing circuit connected to the transition detectors to logically synthesize the detection signals in accordance with the selection control signal and generate the first entry signal.

5. The semiconductor memory device according to claim 1, further comprising a test mode, wherein the control circuit invalidates the second entry signal in accordance with a test signal used to enter the test mode and generates the second mode trigger signal in response to the first entry signal.

6. The semiconductor memory device according to claim 1, wherein the entry signal generation circuit logically synthesizes the input signals in accordance with the selection control signal and further generates a third entry signal used to enter the second access mode.

7. The semiconductor memory device according to claim 6, wherein the entry signal generation circuit includes:
    a plurality of transition detectors, each detecting transition of an associated one of the input signals to generate a detection signal; and
    a pulse synthesizing circuit connected to the transition detectors to logically synthesize the detection signals in accordance with the selection control signal and generate the first and third entry signals.

8. The semiconductor memory device according to claim 6, wherein the control circuit invalidates the second entry signal in accordance with a test signal used to enter the test mode and generates the second mode trigger signal in response to the third entry signal.

9. The semiconductor memory device according to claim 6, wherein the control circuit includes:
    a mode trigger generation circuit connected to the entry signal generation circuit to generate the first mode trigger signal in response to the first entry signal;
    a determination circuit connected to the entry signal generation circuit to invalidate the second entry signal in accordance with a test signal and generate the second mode trigger signal in response to the third entry signal; and
    an internal operation signal generation circuit connected to the mode trigger generation circuit and the determination circuit to generate an internal operation signal in accordance with the first mode trigger signal and the second mode trigger signal.

10. The semiconductor memory device according to claim 1, wherein the input signals include a plurality of control signals and a plurality of address signals.

11. The semiconductor memory device according to claim 1, further comprising a selection signal generation circuit connected to the entry signal generation circuit to generate the selection control signal.

12. The semiconductor memory device according to claim 1, further comprising a timer connected to the control circuit to generate the second entry signal.

13. The semiconductor memory device according to claim 1, wherein the first access mode is a read operation mode or a write operation mode, and the second access mode is a self refresh operation mode.

14. A semiconductor memory device comprising:
    first and second access modes and an entry signal generation circuit for logically synthesizing a plurality of input signals to generate an entry signal used to enter the first access mode or the second access mode; and a control circuit connected to the entry signal generation circuit to generate a first mode trigger signal, which is used to start the first access mode, in response to the entry signal and to generate a second mode trigger signal, which is used to start the second access mode, in response to the entry signal;

wherein the entry signal generation circuit logically synthesizes the input signals in a selective manner in accordance with a predetermined selection control signal to inhibit the generation of the entry signal.

15. A semiconductor memory device comprising:

first and second access modes and an entry signal generation circuit for logically synthesizing a plurality of input signals to generate a first entry signal used to enter the first access mode and a second entry signal used to enter the second access mode; and a control circuit connected to the entry signal generation circuit to generate a first mode trigger signal, which is used to start the first access mode, in response to the first entry signal and to generate a second mode trigger signal, which is used to start the second access mode, in response to the second entry signal;

wherein the entry signal generation circuit logically synthesizes the input signals in a selective manner in accordance with a predetermined selection control signal to inhibit the generation of the first entry signal or the second entry signal.

16. A method for testing a semiconductor memory device having a first access mode, a second access mode, and a test mode, the method comprising:

receiving a test signal to enter the test mode;

receiving a plurality of input signals;

selecting at least one of the input signals and detecting transition of the selected at least one of the input signals; and starting one of the access modes in accordance with the transition detection of the selected at least one of input signals.

17. The method according to claim 16, further comprising:

performing the other access mode in correspondence with the transition of the selected at least one of input signals after said one of the access modes is completed.

18. The method according to claim 17, further comprising:

performing said other access mode in correspondence with the transition of at least one of the input signals excluding the selected at least one of input signals.

19. The method according to claim 16, wherein the semiconductor memory device generates an access request signal, which requests entry of said one of the access modes, at predetermined time intervals, and the starting of said one of the access modes includes invalidating the access request signal with the test signal.

20. A method for testing a semiconductor memory device having a first access mode and a second access mode, the method comprising:

receiving a plurality of input signals;

logically synthesizing the input signals to generate an entry signal used to enter the first access mode or the second access mode; and logically synthesizing the input signals in a selective manner in accordance with a selection control signal to inhibit the generation of the entry signal.

21. A method for testing a semiconductor memory device having a first access mode and a second access mode, the method comprising:

receiving a plurality of input signals;

logically synthesizing the input signals to generate a first entry signal used to enter the first access mode;

logically synthesizing the input signals to generate a second entry signal used to enter the second access mode;

logically synthesizing the input signals in a selective manner in accordance with a selection control signal to inhibit the generation of the first entry signal or the second entry signal.

* * * * *